(12) United States Patent
Shin et al.

(10) Patent No.: US 12,627,309 B2
(45) Date of Patent: May 12, 2026

(54) ANALOG-TO-DIGITAL CONVERSION CIRCUIT, RECEIVER INCLUDING THE SAME, AND TIMING CALIBRATION CIRCUIT

(71) Applicant: SAMSUNG ELECTRONICS CO., LTD., Suwon-si (KR)

(72) Inventors: Hyochul Shin, Suwon-si (KR); Sungno Lee, Suwon-si (KR); Junsang Park, Suwon-si (KR); Kyunghoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 38 days.

(21) Appl. No.: 18/760,845

(22) Filed: Jul. 1, 2024

(65) Prior Publication Data

US 2025/0192790 A1 Jun. 12, 2025

(30) Foreign Application Priority Data

Dec. 6, 2023 (KR) ........................ 10-2023-0175441

(51) Int. Cl.
*H03M 1/10* (2006.01)
(52) U.S. Cl.
CPC ................................. *H03M 1/1014* (2013.01)
(58) Field of Classification Search
CPC .. H03M 1/0607; H03M 1/1014; H03M 1/121; H03M 1/0836; G06F 11/0751; H04B 1/16
USPC .................................. 341/155, 118, 120, 159
See application file for complete search history.

(56) References Cited

U.S. PATENT DOCUMENTS

| | | | |
|---|---|---|---|
| 7,482,956 B2 | 1/2009 | Huang et al. | |
| 8,604,954 B2 | 12/2013 | Chen et al. | |
| 8,779,952 B1 | 7/2014 | Zortea | |
| 9,608,652 B2 | 3/2017 | Lee et al. | |
| 10,326,462 B2 | 6/2019 | Taluja et al. | |
| 11,177,822 B2 | 11/2021 | Singh et al. | |
| 11,349,491 B2 | 5/2022 | Bales et al. | |
| 11,646,747 B1 | 5/2023 | Lok | |
| 11,996,857 B2 * | 5/2024 | Lee ..................... | H03M 1/1014 |

(Continued)

FOREIGN PATENT DOCUMENTS

CN 116346131 6/2023

OTHER PUBLICATIONS

Lin et al., "A 10b 2.6GS/s Time-Interleaved SAR ADC with Background Timing-Skew Calibration," 2016 IEEE International Solid-State Circuits Conference, Feb. 2016, pp. 468-470.

(Continued)

*Primary Examiner* — Peguy Jean Pierre
(74) *Attorney, Agent, or Firm* — Fish & Richardson P.C.

(57) ABSTRACT

A analog-to-digital conversion circuit includes a plurality of time interleaved analog-digital converters (TI-ADCs), a timing calibrator configured to calculate calibration values of the plurality of TI-ADCs based on correlation values between target samples output from target TI-ADCs and adjacent samples of adjacent TI-ADCs in two respective cycles and output codes for calibrating time skews of the plurality of TI-ADCs based on the calibration values and a plurality of calibration parameters, and a clock phase adjuster configured to adjust phases of a plurality of clock signals based on the codes.

20 Claims, 20 Drawing Sheets

100

(56)     References Cited

U.S. PATENT DOCUMENTS

| 2021/0211266 | A1* | 7/2021 | Min | H04L 7/0337 |
| 2022/0255553 | A1 | 8/2022 | Zhao et al. | |
| 2022/0337260 | A1* | 10/2022 | Shin | H04B 1/16 |
| 2022/0385297 | A1 | 12/2022 | Lee et al. | |
| 2023/0299783 | A1* | 9/2023 | Araki | H03M 1/1028 |
| | | | | 341/120 |

OTHER PUBLICATIONS

Extended European Search Report in European Appln. No. 24198256.0, mailed on Feb. 14, 2025, 12 pages.

Razavi et al., "Design Considerations for Interleaved ADCs", IEEE Journal of Solid-State Circuits, Aug. 2013, 48(8):1806-1817.

Wei et al., "An 8-Bit 4-GS/s 120-mW CMOS ADC", Proceedings of the IEEE 2013 Custom Integrated Circuits Conference, IEEE, Sep. 22, 2013, pp. 1-4.

\* cited by examiner

FIG. 1

ANALOG-TO-DIGITAL CONVERSION CIRCUIT, RECEIVER INCLUDING THE SAME, AND TIMING CALIBRATION CIRCUIT

CROSS-REFERENCE TO RELATED APPLICATION

This application claims priority under 35 U.S.C. § 119 to Korean Patent Application No. 10-2023-0175441, filed in the Korean Intellectual Property Office on Dec. 6, 2023, the disclosure of which is incorporated by reference herein in its entirety.

BACKGROUND

An analog-to-digital conversion circuit includes a plurality of analog-to-digital converters, and each analog-to-digital converter converts an analog signal into a digital signal using a time-interleaving manner. The number of analog-digital converters may be designed in consideration of the frequency of analog signals to satisfy the Nyquist frequency. The Nyquist frequency is the theory that signals cannot be sampled at frequencies higher than half a sampling frequency. According to the Nyquist frequency, when an analog signal is sampled at regular intervals at a frequency equal to twice the highest frequency in the frequency band of the analog signal (or frequencies included in the analog signal), a sampled signal may be restored to an original signal. As analog signals in high-bandwidth are used for communication, the number of analog-to-digital converters is increasing.

Data distortion may occur due to a timing error called a time skew between a plurality of analog-to-digital converters, and the performance of an analog-to-digital conversion circuit may be deteriorated due to data distortion. In general, a time skew may be calibrated through an auto-correlation operation for each of analog-to-digital converters.

SUMMARY

In general, in some aspects, the present disclosure is directed toward an analog-to-digital conversion circuit having improved analog-to-digital conversion performance by calibrating a time skew occurring in a high-speed analog-to-digital conversion operation for a high-frequency signal without interruption of the analog-to-digital conversion operation, a receiver including the analog-to-digital conversion circuit, and a timing calibration circuit.

According to some aspects, the present disclosure is directed to an analog-to-digital conversion circuit including a plurality of analog-digital converters (ADCs) each configured to sample an analog signal based on a clock signal in a time-interleaving manner, a timing calibrator configured to calculate calibration values of the plurality of ADCs based on correlation values between target samples output from target ADCs from among the plurality of ADCs and adjacent samples of adjacent ADCs adjacent to the target ADCs in two respective cycles, calculate time skews regarding sampling timings of the plurality of ADCs based on the calibration values and a plurality of calibration parameters, and output codes for calibrating the time skews, and a clock phase adjuster configured to adjust phases of a plurality of clock signals to be provided to the plurality of ADCs based on the codes.

According to some aspects, the present disclosure is directed to a receiver including an analog-to-digital conversion circuit configured to convert an analog signal to a digital signal, and an output circuit configured to improve quality of the digital signal. The analog-to-digital conversion circuit includes a plurality of analog-digital converters (ADCs) each configured to sample an analog signal based on a clock signal in a time-interleaving manner, a timing calibrator configured to calculate calibration values of the plurality of ADCs based on correlation values between target samples output from target ADCs from among the plurality of ADCs and adjacent samples of adjacent ADCs adjacent to the target ADCs in two respective cycles, calculate time skews regarding sampling timings of the plurality of ADCs based on the calibration values and a plurality of calibration parameters, and output codes for calibrating the time skews, and a clock phase adjuster configured to adjust phases of a plurality of clock signals to be provided to the plurality of ADCs based on the codes.

According to some aspects, the present disclosure is directed to a timing calibration circuit including auto-correlation calculators each configured to, based on a correlation value between target samples output from target time interleaved analog-to-digital converters (TI-ADCs) from among a plurality of TI-ADCs in two respective cycles and adjacent samples output from adjacent TI-ADCs mutually adjacent to the target TI-ADCs, calculate calibration values of the target TI-ADCs selected in the two respective cycles, and a post-processor configured to, based on the calibration values of the target TI-ADCs and a plurality of calibration parameters determined in advance, calculate time skews regarding sampling timings of the target TI-ADCs.

BRIEF DESCRIPTION OF THE DRAWINGS

Example implementations will be more clearly understood from the following detailed description, taken in conjunction with the accompanying drawings.

FIG. 1 is a block diagram showing an example of an analog-to-digital conversion circuit according to some implementations.

DETAILED DESCRIPTION

Figure 2:
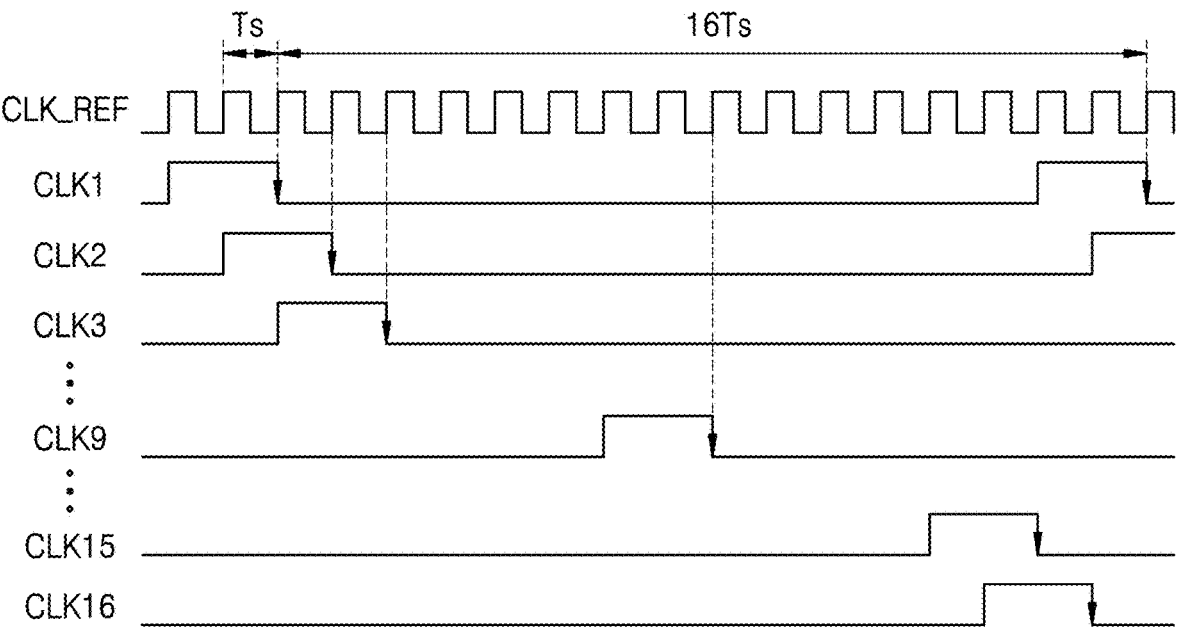
FIG. 2 is a timing diagram illustrating examples of sampling timings of time interleaved analog-to-digital converters (TI-ADCs) according to some implementations.

Hereinafter, example implementations will be explained in detail with reference to the accompanying drawings.

Figure 1:
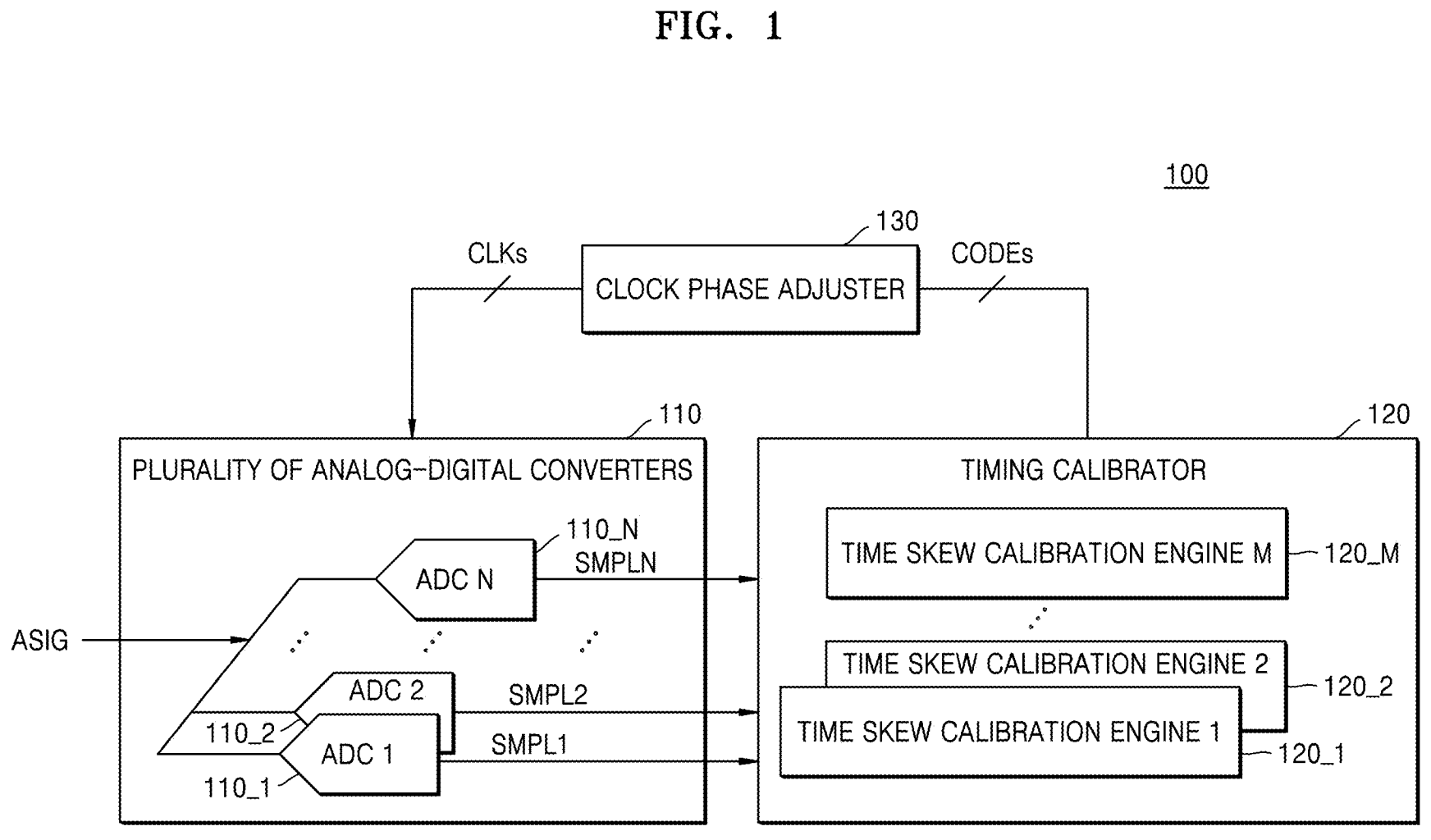

FIG. 1 is a block diagram showing an example of an analog-to-digital conversion circuit according to some implementations. In FIG. 1, an analog-to-digital conversion circuit 100 may include a plurality of analog-to-digital converters 110, a timing calibrator 120, and a clock phase adjuster 130. Analog-to-digital converters may be referred to as 'ADC'.

The number of ADCs 110 may be N, wherein N may be an even number equal to or greater than 2, but is not limited thereto. For example, the plurality of ADCs 110 may include first to N-th ADCs 110_1 to 110_N. From among the first to N-th ADCs 110_1 to 110_N, a 2q-th ADC may correspond to an even channel, and a (2q–1)-th ADC may correspond to an odd channel. q may be a natural number.

The first to N-th ADCs 110_1 to 110_N may operate in a time-interleaving manner. The first to N-th ADCs 110_1 to 110_N may generate samples SMPL1 to SMPLN as digital signals by alternately sampling an analog signal ASIG based on clock signals having different phases. In detail, each of the first to N-th ADCs 110_1 to 110_N may be sequentially selected, receive the analog signal ASIG, sample the analog signal ASIG in response to an edge (e.g., a rising edge or a falling edge) of a clock signal (or at an edge of the clock signal), and output a sample. For example, a first ADC 1101 may sample the analog signal ASIG in response to an edge of a first clock signal. A second ADC 110_2 may sample the analog signal ASIG in response to an edge of a second clock signal. An N-th ADC 110_N may sample the analog signal ASIG in response to an edge of an N-th clock signal. According to some embodiments, the second clock signal may be a signal delayed from the first clock signal. The N-th clock signal may be a signal delayed from an (N–1)-th clock signal. An ADC that operates in the time-interleaving manner may be referred to as a Time Interleaved Analog-to-Digital Converter (hereinafter, referred to as a 'TI-ADC').

According to some implementations, the first to N-th ADCs 110_1 to 110_N each include a sample/hold circuit, which samples the analog signal ASIG in response to an edge of a clock signal and holds a sampled value, and a sub-ADC, which converts a held value to a digital value.

The timing calibrator 120 may receive target samples output from target ADCs from among the first to N-th ADCs 110_1 to 110_N in each of two cycles. For example, the timing calibrator 120 may receive target samples of first target ADCs in a first cycle and receive target samples of second target ADCs in a second cycle. The timing calibrator 120 may receive adjacent samples output from adjacent ADCs adjacent to the above-stated target ADCs. For example, timing calibrator 120 may receive first adjacent samples of first adjacent ADCs in the first cycle and receive second adjacent samples of second adjacent ADCs in the second cycle. Adjacent ADCs may be ADCs adjacent to a target ADC. The number of ADCs adjacent to one target ADC may be two. According to some embodiments, adjacent ADCs may include ADCs selected immediately before a target ADC is selected and ADCs selected immediately after the target ADC is selected. For example, the N-th ADC 110_N and the second ADC 110_2 may be adjacent to the first ADC 110_1, an (N–1)-th ADC and the first ADC 1101 may be adjacent to the N-th ADC 110_N. and an (i–1)-th ADC and an (i+1)-th ADC may be adjacent to an i-th ADC. i may be a natural number equal to or greater than 2 and smaller than or equal to N–1. According to some other embodiments, adjacent ADCs may be physically adjacent to a target ADC.

The timing calibrator 120 may calculate calibration values for a plurality of ADCs based on correlation values between target samples and adjacent samples. A correlation value between a target sample and adjacent samples may be calculated through an auto-correlation operation. Correlation values between a target sample and adjacent samples will be described later with reference to FIGS. 3A, 3B, and 3C.

The timing calibrator 120 may calculate time skews for sampling timings of a plurality of ADCs based on calibration values and a plurality of calibration parameters. A time skew may occur because ADCs actually manufactured through the same process exhibit different physical characteristics. In other words, a time skew may occur due to a mismatch between actually manufactured ADCs. Meanwhile, a plurality of calibration parameters may be determined and set in advance when the analog-to-digital conversion circuit 100 is designed, and will be described later with reference to FIG. 5.

The timing calibrator 120 may output codes CODEs for correcting time skews to the clock phase adjuster 130. For example, the codes CODEs may include a first code for adjusting the phase of a first clock signal, a second code for adjusting the phase of a second clock signal, etc. The codes CODEs will be described later with reference to FIG. 5.

According to some implementations, timing calibrator 120 may include a plurality of time skew calibration engines. The number of time skew calibration engines may be M, and M may be a natural number equal to or greater than 2. For example, the plurality of time skew calibration engines may include first to M-th time skew calibration engines 120_1 to 120_M. The first to M-th time skew calibration engines 120_1 to 120_M may operate in parallel. The first to M-th time skew calibration engines 120_1 to 120_M may each calculate correlation values for a target sample of one target ADC and adjacent samples of two adjacent ADCs adjacent to the one target ADC. The first to M-th time skew calibration engines 120_1 to 120_M will be described later with reference to FIGS. 5, 10, 11, and 12.

The clock phase adjuster 130 may adjust phases of a plurality of clock signals CLKs to be provided to the plurality of ADCs 110 based on the codes CODEs. For example, when a sampling timing according to an edge of the first clock signal is later than a normal timing, the clock phase adjuster 130 may adjust the phase of the first clock signal to be earlier than the phase of the first clock signal. According to some embodiments, the clock phase adjuster 130 may include a phase locked loop (PLL) circuit that generates a reference clock signal and a delay circuit that outputs the plurality of clock signals CLKs to the first to N-th ADCs 110_1 to 110_N based on the reference clock signal. The number of the plurality of clock signals CLKs may also be N.

According to some implementations, analog-to-digital conversion performance may be improved by calibrating a time skew occurred in a high-speed analog-to-digital conversion operation for a high-frequency signal without stopping the analog-to-digital conversion operation.

FIG. 2 is a timing diagram illustrating examples of sampling timings o In FIG. 2, the number of the plurality of ADCs 110 may be 16. Hereinafter, the sampling timings of FIG. 2 will be described based on 16 ADCs. However, the present disclosure is not limited thereto. According to some implementations, the number of the plurality of ADCs 110 may vary, e.g., 2, 4, 8, 32, etc.

A reference clock signal CLK_REF and first to sixteenth clock signals CLK1 to CLK16 may be generated by the clock phase adjuster 130. The first to sixteenth clock signals CLK1 to CLK16 may be generated based on the reference clock signal CLK_REF. The period of each of the first to sixteenth clock signals CLK1 to CLK16 may be 16 times a period Ts of the reference clock signal CLK_REF.

The phase difference between the first to sixteenth clock signals CLK1 to CLK16 may correspond to the period Ts of the reference clock signal CLK_REF, a frequency corresponding to the phase difference between the first to sixteenth clock signals CLK1 to CLK16 may be a sampling frequency, and the sampling frequency may be twice the maximum frequency of the analog signal ASIG. For example, when the maximum frequency of the analog signal ASIG is 8 [GHz], the sampling frequency of the plurality of ADCs 110 may be 16 [GHz]. The plurality of ADCs 110 with the sampling frequency of 16 [GHz] may be implemented with 16 ADCs each having the sampling frequency of 1 [GHz].

The plurality of ADCs 110 may each sample the analog signal ASIG at falling edges of the first to sixteenth clock signals CLK1 to CLK16. However, the sampling timing is not limited to the falling edge of a clock signal, and the analog signal ASIG may be sampled at the rising edge of the clock signal.

Figure 3A:
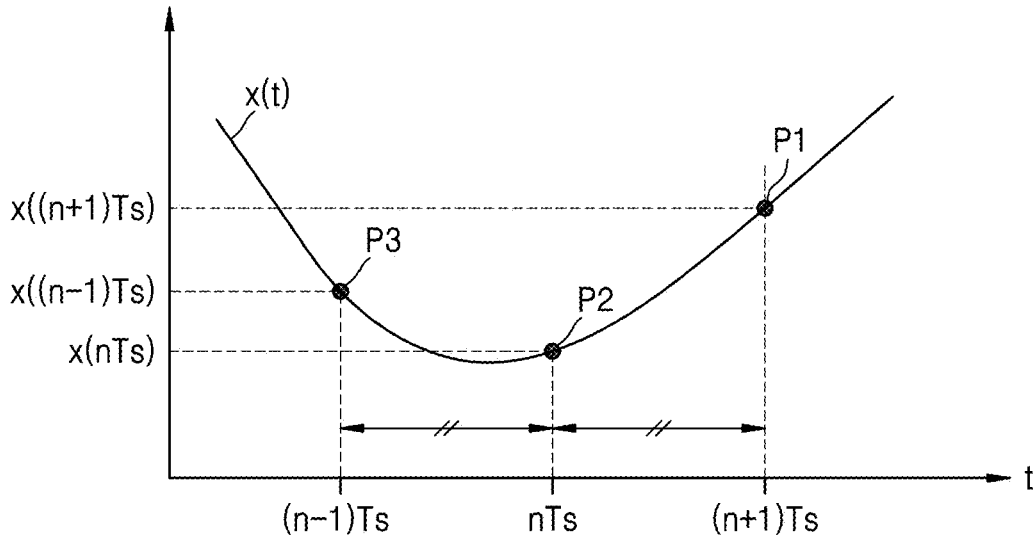
FIGS. 3A, 3B, and 3C are graphs illustrating examples of sampling timing and time skew according to some implementations.
Figure 3B:
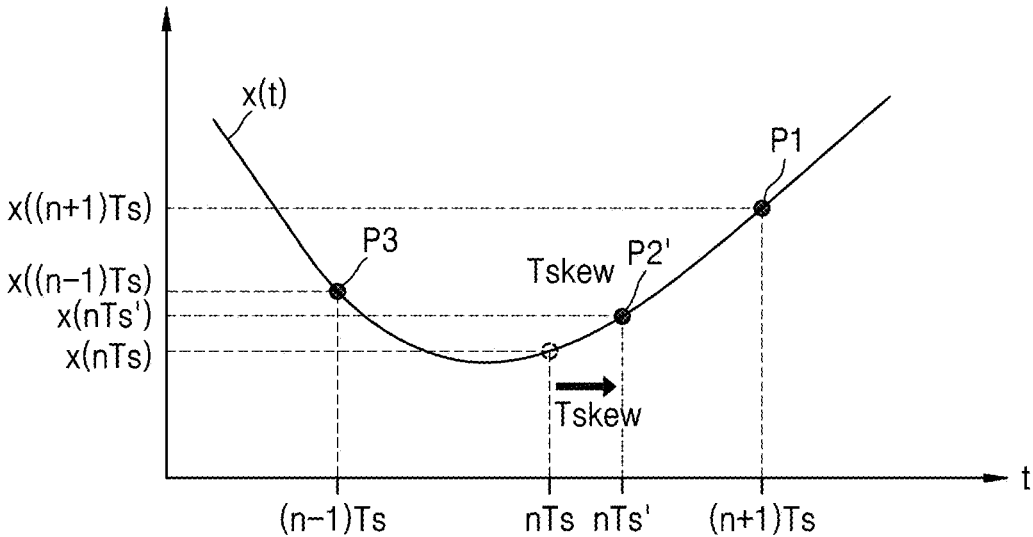
Figure 3C:
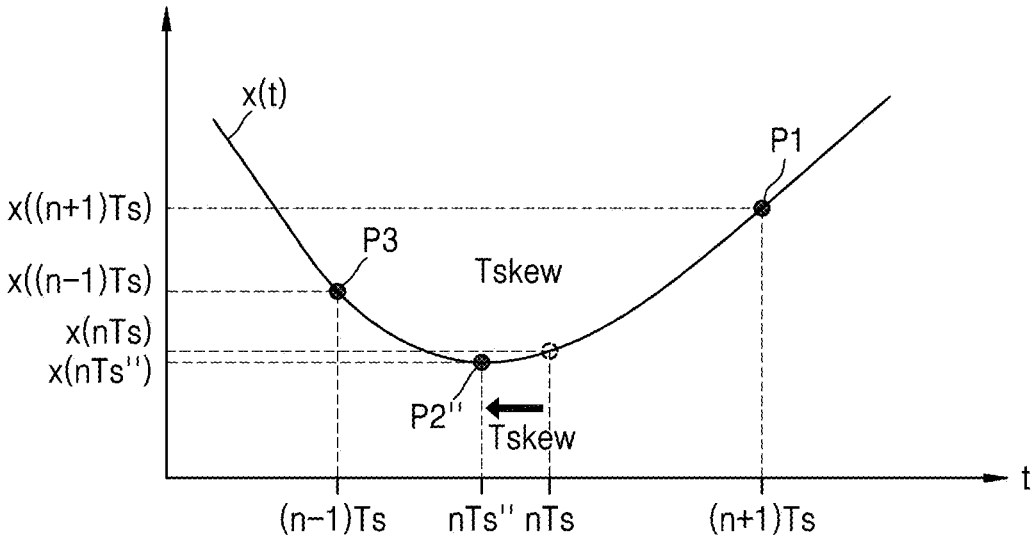

FIGS. 3A, 3B, and 3C are graphs illustrating examples of sampling timing and time skew according to some implementations. In FIGS. 3A, 3B, and 3C, a signal x(t) may correspond to the analog signal ASIG. First to third points P1 to P3 represent samplings by an x-th ADC, a y-th ADC, and a z-th ADC, respectively, and respective samples x((n−1)Ts, x(nTs), and x((n+1)Ts)) of the first to third points P1 to P3 may be output. x, y, z may each be a natural number. Hereinafter, it will be assumed that a first point P1 represents sampling by the x-th ADC, the second point P2 represents sampling by the y-th ADC, and the third point P3 represents sampling by the z-th ADC.

When the y-th ADC is a target ADC, the correlation value between the x-th ADC, the y-th ADC, and the z-th ADC may be calculated by using the difference between the product of two samples x((n−1)Ts) and x(nTs) and the products of two samples x(nTs) and x((n+1)Ts). For example, the correlation value for a target ADC may be calculated according to Equation 1 below.

$$\Delta D(n) = \qquad\qquad\qquad\qquad \text{[Equation 1]}$$

$$x((n+1)T_s)\cdot x(nT_s - T_{skew}) - x((n-1)T_s)\cdot x(nT_s - T_{skew})$$

In Equation 1, $\Delta D(n)$ may also be referred to as a discriminant. $T_{skew}$ may be the time skew, and $T_s$ may be the sampling period.

In FIG. 3A, the first to third points P1 to P3 may have been sampled by three ADCs without the time skew $T_{skew}$.

In FIG. 3B, the time skew $T_{skew}$ occurs, and thus the signal x(t) may be sampled at a sampling time nTs', which is lagged by the time skew $T_{skew}$ from a sampling time nTs. At this time, unlike the second point P2 of FIG. 3A, a second point P2' of FIG. 3B may be closer to the first point P1 than to the third point P3, and the correlation value for a target ADC according to Equation 1 may be greater than zero.

In FIG. 3C, the time skew $T_{skew}$ occurs, and the signal x(t) may be sampled at a sampling time nTs", which leads a sampling time nTs by the time skew $T_{skew}$. At this time, unlike the second point P2 of FIG. 3A, a second point P2" of FIG. 3C may be closer to the third point P3 than to the first point P1, and the correlation value for a target ADC according to Equation 1 may be smaller than zero.

Figure 4:
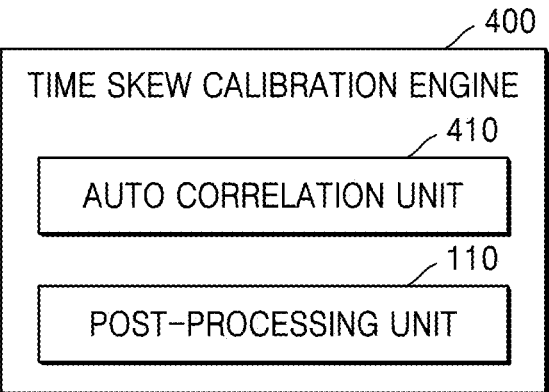
FIG. 4 is a block diagram showing an example of a time skew calibration engine according to some implementations.

FIG. 4 is a block diagram showing an example of a time skew calibration engine according to some implementations. In FIGS. 1 and 4, each time skew calibration engine 400 included in the timing calibrator 120 may include an auto-correlation calculation unit 410 and a post-processing unit 420.

The auto-correlation calculation unit 410 may calculate a correlation value between a target sample of a target ADC and peripheral samples of peripheral ADCs in each cycle. The peripheral ADCs may include adjacent ADCs adjacent to the target ADC and/or ADCs that are not adjacent to the target ADC. A correlation value may be calculated according to Equation 1 described above with reference to FIGS. 3A, 3B, and 3C. According to some implementations, the auto-correlation calculation unit 410 may calculate a correlation value between a target sample of a target ADC and adjacent samples of adjacent ADCs in each of two cycles. According to some implementations, the auto-correlation calculation unit 410 may calculate a correlation value between the target sample of the target ADC and samples of ADCs that are not adjacent to the target ADC. According to some implementations, the auto-correlation calculation unit 410 may calculate a correlation value between the target sample of the target ADC and samples of the adjacent ADCs. The auto-correlation calculation unit 410 may calculate a calibration value of a target ADC selected in each cycle based on the correlation value. The auto-correlation calculation unit 410 may be referred to as an auto-correlation calculator.

The post-processing unit 420 may calculate time skews based on calibration values of target ADCs and a plurality of calibration parameters and output codes for calibrating the time skews. According to an embodiment, the post-processing unit 420 may calculate time skews based on calibration values of target ADCs selected in two cycles and a plurality of calibration parameters determined in advance. The post-processing unit 420 may be referred to as a post-processor.

Figure 5:
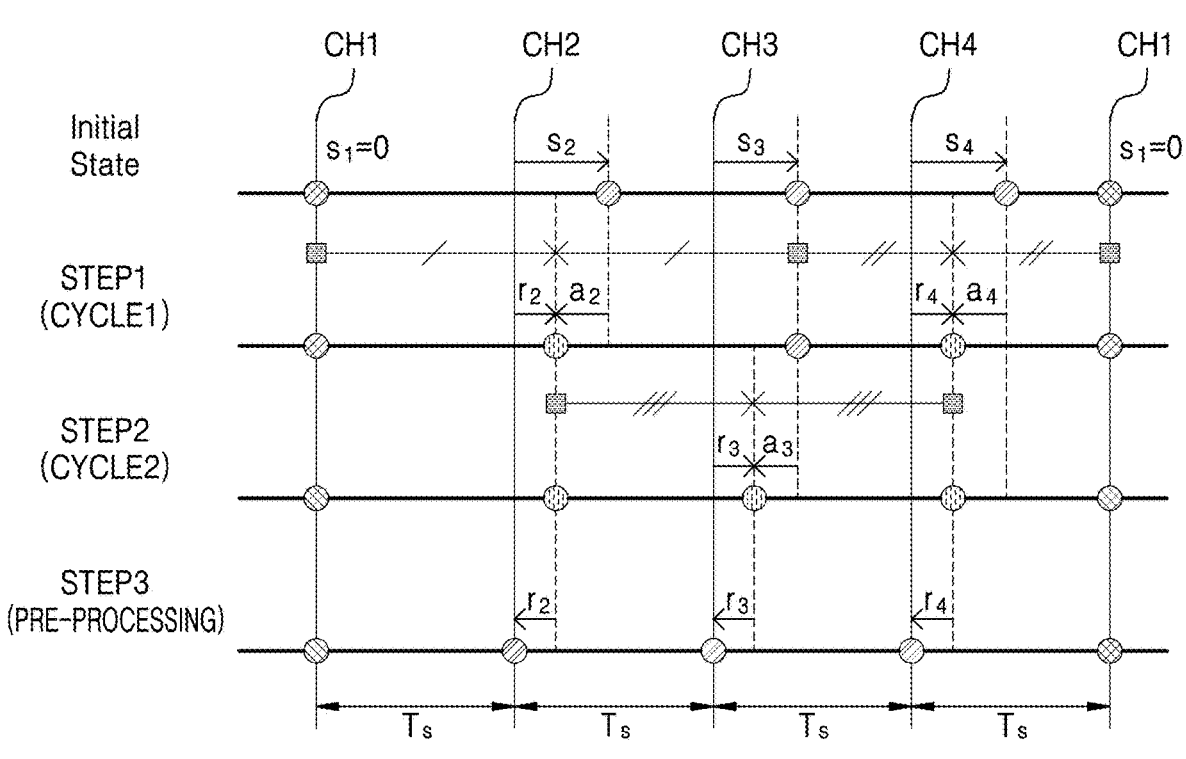
FIG. 5 is a diagram illustrating an example of calibrating a time skew according to some implementations.

FIG. 5 is a diagram illustrating an example of calibrating a time skew according to some implementations. In FIG. 5, it is assumed that the number of ADCs is four, for convenience of explanation. Four channels may be formed according to four ADCs. One channel may correspond to one ADC. For example, an r-th channel may correspond to an r-th ADC. In FIG. 5, channel lines CH1, CH2, CH3, and CH4 may correspond to a reference time line (or a timing line) that an ADC samples without a time skew and may be spaced apart from one another by a certain time interval (e.g., the period Ts). In FIG. 5, since a fourth ADC and a first ADC are adjacent to each other and first to fourth ADCs are alternately selected again after the fourth ADC is selected, a first channel line CH1 is additionally shown next to a fourth channel line CH4, and, although not shown, second to fourth channel lines CH2, CH3, and CH4 may also be additionally shown. In FIG. 5, a sample located on a channel line indicates that the analog signal ASIG is sampled without a time skew, and a sample not located on a channel line indicates that the analog signal ASIG is sampled with a time skew.

In an initial state, time skews $s_1$, $s_2$, $s_3$, and $s_4$ may occur at four ADCs, respectively. The time skews $s_1$, $s_2$, $s_3$, and $s_4$ may be unknowns. Due to the time skews $s_1$, $s_2$, $s_3$, and $s_4$, samples lagged from or leading the channel lines CH1, CH2, CH3, and CH4 may be generated, and such samples may be referred to as uncalibrated samples US. According to some implementations, a plurality of time skew calibration engines set a sample of the first ADC as a reference sample RS, and it is assumed that a first time skew $s_1$ occurring at the first ADC is 0. Accordingly, calculation speed may be improved by reducing the number of unknowns.

A first step STEP1 is a step of calculating calibration values for target ADCs selected in a first cycle CYCLE1. The auto-correlation calculation unit 410 may calculate first calibration values of first target ADCs based on first correlation values between first target samples corresponding to any one channel of even number channels and odd number channels and first adjacent samples of first adjacent ADCs adjacent to the first target ADCs.

For example, with reference to FIG. 5, in the first cycle CYCLE1, first target ADCs may include a second ADC and a fourth ADC corresponding to even number channels. In this case, the auto-correlation calculation unit 410 included in a first time skew calibration engine 120_1 may calculate the correlation value of the second ADC by using samples of first to third ADCs and the above-stated Equation 1 and calculate a calibration value $a_2$ of the second ADC based on the correlation value of the second ADC. Since a calibrated sample CS of the second ADC is calibrated based on samples with time skews rather than calibrated samples, the calibrated sample CS of the second ADC may still be spaced apart from a second channel line CH2 by the $r_2$. A separation value $r_2$ may be an unknown. The separation value $r_2$ may correspond to half of the sum of a first time skew $s_1$ and a third time skew $s_3$, according to an auto-correlation calculation. In other words, the separation value $r_2$ may be expressed as Equation 2 below.

$$r_2 = \frac{s_1 + s_3}{2} \qquad \text{[Equation 2]}$$

Meanwhile, the calibration value $a_2$ of the second ADC may correspond to the difference between the separation value $r_2$ and a second time skew $s_2$, and the calibration value $a_2$ of the second ADC may be expressed by using first to third time skews $s_1$, $s_2$, and $s_3$, according to Equation 2 described above. In other words, the relationship between the calibration value $a_2$ of the second ADC and the first to third time skews $s_1$, $s_2$, and $s_3$ may be expressed as Equation 3 below.

$$a_2 = r_2 - s_2 = \frac{1}{2}s_1 + \frac{1}{2}s_3 - s_2 \qquad \text{[Equation 3]}$$

Meanwhile, the auto-correlation calculation unit 410 included in a second time skew calibration engine 120_2 may calculate the correlation value of the fourth ADC by using samples of first, third, and fourth ADCs and the above-stated Equation 1 and calculate a calibration value $a_4$ of the fourth ADC based on the correlation value of the fourth ADC. Likewise, since the calibrated sample CS of the fourth ADC is calibrated based on samples in which time skews occurred, the calibrated sample CS of the fourth ADC may still be spaced apart from the fourth channel line CH4 by $r_4$. The separation value $r_4$, which is an unknown, may correspond to half of the sum of the first time skew $s_1$ and the third time skew $s_3$, as shown in Equation 4 below.

$$r_4 = \frac{s_3 + s_1}{2} \qquad \text{[Equation 4]}$$

A calibration value of the fourth ADC $a_4$ may correspond to the difference between the separation value $r_4$ and a fourth time skew $s_4$ and may be expressed by using first, third, and fourth time skews $s_1$, $s_3$, and $s_4$, as shown in Equation 5 below.

$$a_4 = r_4 - s_4 = \frac{1}{2}s_3 + \frac{1}{2}s_1 - s_4 \qquad \text{[Equation 5]}$$

A second step STEP2 is a step of calculating calibration values for target ADCs selected in a second cycle CYCLE2 after the first cycle CYCLE1. In the first cycle CYCLE1, auto-correlation calculation units 410 may calculate second calibration values of second target ADCs based on second correlation values between second target samples of second target ADCs different from the first target ADCs and second adjacent samples of second adjacent ADCs adjacent to the second target ADCs.

For example, with reference to FIG. 5, in the second cycle CYCLE2, second target ADCs may include a first ADC and a third ADC corresponding to odd number channels. When the sample of the first ADC is set as the reference sample RS, the third ADC may be selected as the second target ADC in the second cycle CYCLE2. The auto-correlation calculation unit 410 included in the first time skew calibration engine 120_1 may calculate the correlation value of the third ADC by using samples of second to fourth ADCs and the above-stated Equation 1 and calculate a calibration value $a_3$ of the third ADC based on the correlation value of the third ADC. Similar to that described above, the separation value $r_3$, which is an unknown, may correspond to half of the sum of the second time skew $s_2$ and the fourth time skew $s_4$, as shown in Equation 7 below.

$$r_3 = \frac{s_2 + s_4}{2} \qquad \text{[Equation 7]}$$

Meanwhile, as shown in Equation 8 below, the calibration value of the third ADC $a_3$ corresponds to the difference between the separation value $r_3$ and the third time skew $s_3$ and may be expressed by using second to fourth time skews $s_2$, $s_3$, and $s_4$.

$$a_3 = r_3 - s_3 = \frac{1}{2}s_2 + \frac{1}{2}s_4 - s_3 \qquad \text{[Equation 8]}$$

In a third step STEP3, the post-processing unit 420 may calculate time skews based on calibration values of a plurality of ADCs and a plurality of parameters. For example, referring to FIG. 5, the relationship between the calibration values $a_2$, $a_3$, and $a_4$ of the second to fourth ADCs and the second to fourth time skews $s_2$, $s_3$, and $s_4$ may be expressed as shown in Equation 9 below.

$$\begin{bmatrix} s_2 \\ s_3 \\ s_4 \end{bmatrix} = \begin{bmatrix} -1 & 1/2 & 0 \\ 0 & -1/2 & 0 \\ 0 & 1/2 & -1 \end{bmatrix}^{-1} \begin{bmatrix} a_2 \\ a_3 \\ a_4 \end{bmatrix} = H^{-1} \begin{bmatrix} a_2 \\ a_3 \\ a_4 \end{bmatrix}$$

[Equation 9]

In the Equation 9 above, elements included in a matrix $H^{-1}$ may be referred to as calibration parameters. In other words, the matrix $H^{-1}$ may include a plurality of calibration parameters. The calibration parameters may be determined in advance. Meanwhile, the above-stated Equation 9 may be an equation determined when it is assumed that the first time skew $s_1$ is 0 as the sample of the first ADC is set as the reference sample RS. When the sample of an ADC different from the first ADC is set as the reference sample RS or the reference sample RS is not set, the relationship between a calibration value and a time skew may be determined similarly as the method of deriving the Equation 9 described above. Also, in FIG. 5, the relationship between a calibration value and a time skew is described based on four ADCs. However, the relationship between a calibration value and a time skew based on two ADCs may be determined similarly as that described above with reference to FIG. 5, and the relationship based on two ADCs may be expressed as shown in Equation 10 below.

$$\begin{bmatrix} s_1 \\ s_2 \end{bmatrix} = H^{-1} \begin{bmatrix} a_1 \\ a_2 \end{bmatrix}$$

[Equation 10]

$s_1$ may denote a first timing skew of a first target ADC, $s_2$ may denote a second timing skew of a second target ADC, $H^{-1}$ may denote a matrix containing a plurality of calibration parameters, $a_1$ may denote a first calibration value of the first target ADC, and $a_2$ may denote a second calibration value of the second target ADC.

Also, even based on 8, 16, or 32 ADCs, the relationship between a calibration value and a time skew may be determined similarly as described above, and the relationship between calibration values and time skews for n ADCs may be expressed as shown in Equation 11 below.

$$\begin{bmatrix} s_1 \\ s_k \\ \vdots \\ s_n \end{bmatrix} = H^{-1} \begin{bmatrix} a_1 \\ a_k \\ \vdots \\ a_n \end{bmatrix}$$

[Equation 11]

In the Equation 11 above, $s_k$ may denote a timing skew for a sampling timing of a k-th ADC, k may be a natural number greater than or equal to 2 and smaller than n, $H^{-1}$ may denote a matrix containing a plurality of calibration parameters, and $a_k$ may denote a calibration value of the k-th ADC.

Skew-free samples SFS may be samples without a time skew and may be located on the channel lines CH1, CH2, CH3, and CH4.

Accordingly, by calibrating a time skew generated in an analog-to-digital conversion operation for a signal in the Nyquist frequency band even in the background operation, the time for a calibration operation may be reduced and the performance of the analog-to-digital conversion circuit 100 may be improved.

Figure 6:
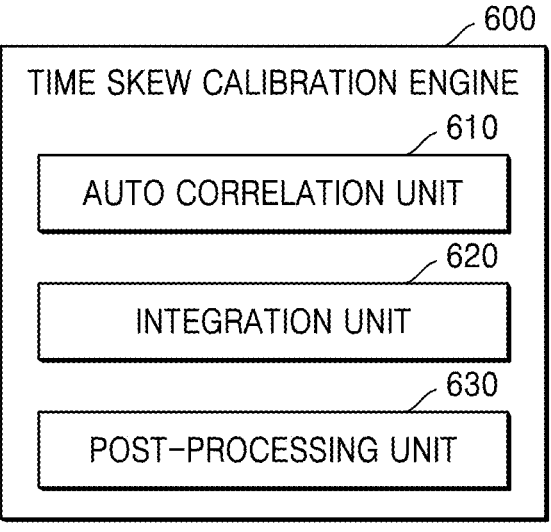
FIG. 6 is a block diagram showing an example of a time skew calibration engine according to some implementations.

FIG. 6 is a block diagram showing an example of a time skew calibration engine according to some implementations.

In FIG. 6, each time skew calibration engine 600 may include an auto-correlation calculation unit 610, an integrator 620, and a post-processing unit 630.

The auto-correlation calculation unit 610 may repeatedly calculate a correlation value in each cycle by calculating the difference between a first value obtained by multiplying a target sample by a first adjacent sample of a first adjacent ADC and a second value obtained by multiplying the target sample by a second adjacent sample of a second adjacent ADC. The auto-correlation calculation unit 610 may calculate a plurality of calibration values of each ADC based on the plurality of correlation values of each ADC. According to some implementations, the auto-correlation calculation unit 610 may obtain a plurality of first calibration values by repeatedly calculating a first calibration value of a first target ADC in a first cycle and obtain a plurality of second calibration values by repeatedly calculating a second calibration value of a second target ADC in a second cycle.

Referring to FIG. 5, for example, in the first cycle CYCLE1, the auto-correlation calculation unit 610 included in the first time skew calibration engine 120_1 may repeatedly calculate a correlation value of the second ADC by using samples of first to third ADCs and the Equation 1 above, and the auto-correlation calculation unit 610 included in the second time skew calibration engine 120_2 may repeatedly calculate a correlation value of the fourth ADC by using samples of first, third, and fourth ADCs and the Equation 1 above. The auto-correlation calculation units 610 may calculate calibration values of the second ADC based on correlation values of the second ADC and may calculate calibration values of the fourth ADC based on correlation values of the fourth ADC.

In the second cycle CYCLE2, the auto-correlation calculation unit 610 may repeatedly calculate a correlation value of the third ADC and calculate calibration values of the third ADC based on correlation values of the third ADC. The number of repetitions, or the total number of correlation values or calibration values may be $2^{20}$ or $2^{24}$, but is not limited thereto.

The integrator 620 may calculate an average calibration value of each of a plurality of ADCs by calculating an average of a plurality of calibration values of each ADC. According to some implementations, the integrator 620 may calculate a first average calibration value of a first target ADC by calculating an average of a plurality of first calibration values of the first target ADC and calculate a second average calibration value of a second target ADC by calculating an average of a plurality of second calibration values of the second target ADC. For example, referring to FIG. 5, the integrator 620 may calculate an average calibration value of the second ADC by calculating an average of calibration values of the second ADC. Also, another integrator 620 may calculate an average calibration value of the fourth ADC by calculating an average of calibration values of the fourth ADC. Alternatively, one integrator 620 may calculate an average calibration value of the third ADC by calculating an average of calibration values of the third ADC.

The post-processing unit 630 may calculate time skews by using the relationship between average calibration values and time skews (e.g., Equation 9, Equation 10, or Equation 11) and average calibration values of target ADCs.

Accordingly, by repeatedly performing calibration operations, time skews may be calculated more accurately.

Figure 7:
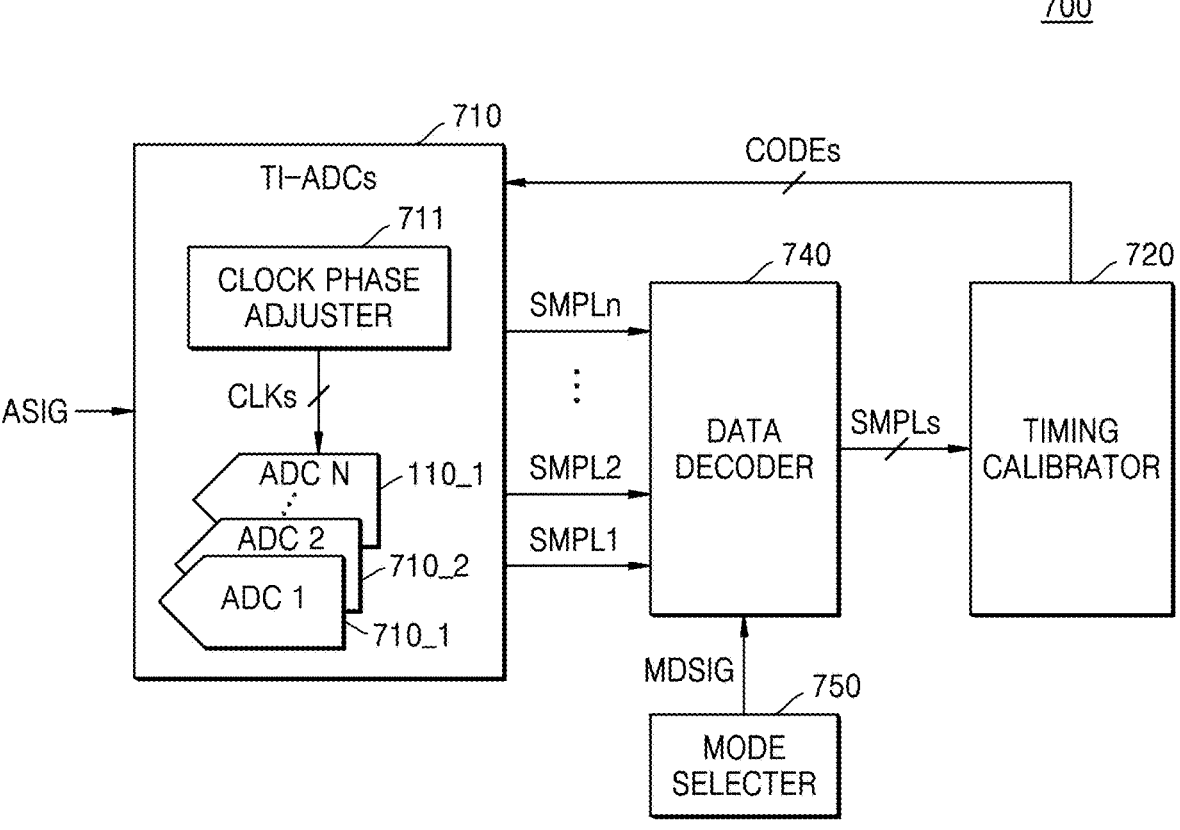
FIG. 7 is a block diagram showing an example of an analog-to-digital conversion circuit according to some implementations.

FIG. 7 is a block diagram showing an example of an analog-to-digital conversion circuit according to some implementations. In FIG. 7, an analog-to-digital conversion circuit 700 may include TI-ADCs 710, a timing calibrator 720, a data decoder 740, and a mode selector 750.

According to some implementations, the TI-ADCs 710 may include first to N-th ADCs 710_1 to 710_N and a clock phase adjuster 711. However, the inventive concept is not limited thereto. According to some implementations, the TI-ADCs 710 may include the first to N-th ADCs 710_1 to 710_N, and the clock phase adjuster 711 may be provided outside the TI-ADCs 710. The first to N-th ADCs 710_1 to 710_N may be identical to the first to N-th ADCs 110_1 to 110_N of FIG. 1. The clock phase adjuster 711 may be identical to the clock phase adjuster 130 of FIG. 1.

The timing calibrator 720 may output codes CODEs for calibrating time skews to the TI-ADCs 710. The timing calibrator 720 may perform the same calibration operation as that of the timing calibrator 120 of FIG. 1.

The data decoder 740 may execute a calibration mode selected from among a plurality of calibration modes according to a mode signal MDSIG. According to some implementations, the calibration mode may include a first calibration mode for performing a foreground calibration operation and a second calibration mode for performing a background calibration operation. The foreground calibration operation may be a calibration operation that may be quickly performed when an event such as power-on, reboot, or reset occurs in the analog-to-digital conversion circuit 700. The background calibration operation may be a calibration operation that may be performed when the internal (operational) environment of the analog-to-digital conversion circuit 700 is outside a normal operation range or after an event as stated above occurs. According to some implementations, the background calibration operation may include the implementation described above with reference to FIG. 5 and implementations described later with reference to FIGS. 10 and 11. The operation speed of a foreground calibration operation may be relatively faster than the operation speed of a background calibration operation. In the foreground calibration operation, a signal with a frequency lower than the frequency of the analog signal ASIG input to the analog-to-digital conversion circuit 700 may be used, and thus, while the foreground calibration operation is being performed, the analog-to-digital conversion operation of the analog-to-digital conversion circuit 700 may be interrupted. On the other hand, while a background calibration operation is being performed, an analog-to-digital conversion operation of the analog-to-digital conversion circuit 700 may be performed without interruption.

The data decoder 740 may output at least one sample group including samples SMPLs of three ADCs, which are selected based on a calibration mode from among the samples SMPL1 to SMPLn of the TI-ADCs 710, to the timing calibrator 720. For example, in the first calibration mode, the data decoder 740 may output, in some cycles, a target sample of a target ADC and two non-adjacent samples of two non-adjacent ADCs to the timing calibrator 720, and, in another cycle, output the target sample of the target ADC and two adjacent samples of two adjacent ADCs to the timing calibrator 720. In another example, in the second calibration mode, the data decoder 740 may output the target sample of the target ADC and two adjacent samples of two adjacent ADCs to the timing calibrator 720 in each cycle.

The mode selector 750 may output the mode signal MDSIG indicating a calibration mode to the data decoder 740 based on the internal environment and a reference range of the analog-to-digital conversion circuit 700.

Accordingly, when the analog-to-digital conversion circuit 700 is powered on or reset, a time skew may be quickly calibrated or the time skew may be calibrated without interruption of an analog-to-digital conversion operation of the analog-to-digital conversion circuit 700, and thus the performance of the analog-to-digital conversion circuit 700 may be improved.

Figure 8:
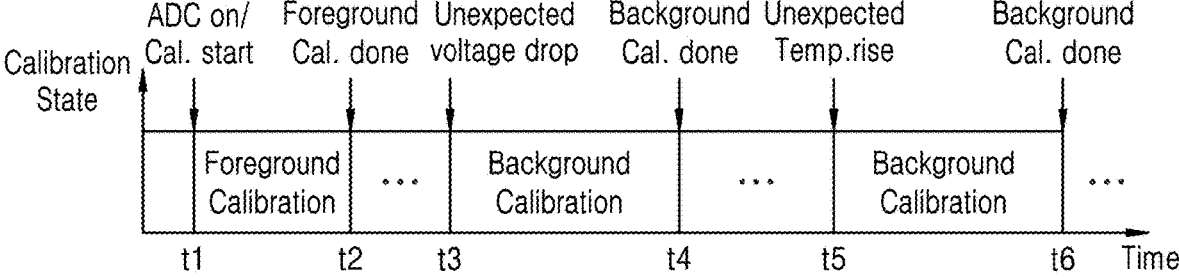
FIG. 8 is a diagram illustrating examples of calibration operations of the analog-to-digital conversion circuit of FIG. 7 according to some implementations.

FIG. 8 is a diagram illustrating examples of calibration operations of the analog-to-digital conversion circuit of FIG. 7 according to some implementations. In FIGS. 7 and 8, at a time point t1, when power is supplied to the analog-to-digital conversion circuit 700, a foreground calibration operation may be performed. At a time point t2, the foreground calibration operation may be completed. At a time point t3, when the voltage of the analog-to-digital conversion circuit 700 drops unexpectedly, a background calibration operation may be performed. According to some implementations, the background calibration operation according to the implementation described above with reference to FIG. 5 may be performed preferentially, but the present disclosure is not limited thereto. According to some implementations, the implementation described above with reference to FIG. 5 and the implementations described below with reference to FIGS. 10 and 11 may optionally be performed as a background calibration operation.

At a time point t4, the background calibration operation may be completed. At a time point t5, when the temperature of the analog-to-digital conversion circuit 700 increases unexpectedly, a background calibration operation may be performed, and, at a time point t6, the background calibration operation may be completed. Although FIG. 8 shows that the background operation is performed when the voltage of the analog-to-digital conversion circuit 700 decreases or the temperature of the analog-to-digital conversion circuit 700 increases, implementations of the present disclosure are not limited to FIG. 8. According to some implementations, a background calibration operation may be performed even when the voltage of the analog-to-digital conversion circuit 700 increases rapidly or the temperature of the analog-to-digital conversion circuit 700 rapidly decreases or when physical characteristics of the analog-to-digital conversion circuit 700 other than the voltage and the temperature change unexpectedly.

Figure 9:
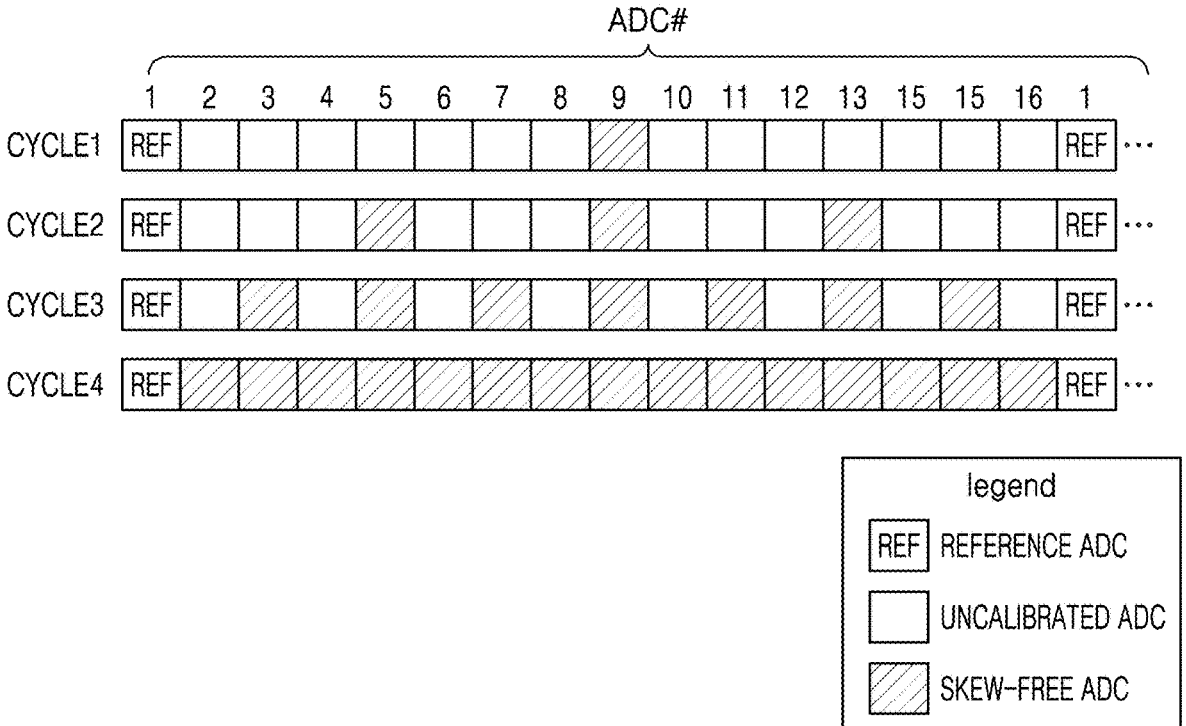
FIG. 9 is a diagram illustrating an example of a foreground calibration operation according to some implementations.

FIG. 9 is a diagram illustrating an example of a foreground calibration operation according to some implementations. In FIG. 9, the mode selector 750 may output a first mode signal to the data decoder 740. Next, based on correlation values between the sample of a reference ADC from among the TI-ADCs 710 and a sample of an i-th target ADC that is furthest away from the reference ADC, the timing calibrator 720 may determine a time skew of the i-th target ADC. Next, based on correlation values between the sample of the reference ADC and a sample of an ADC whose time skew has been calibrated, the timing calibrator 720 may calculate time skews of (i+1)-th target ADCs that are equally spaced apart from the reference ADC and the ADC whose time skew has been calibrated. Next, based on correlation values between samples of ADCs whose time skews have been calibrated, the timing calibrator 720 may calculate time skews of (i+1)-th target ADCs that are equally spaced apart from the ADCs whose time skews have been calibrated. Hereinafter, it is assumed that the number of ADCs is 16. From among 16 ADCs, a first ADC may be set as the reference ADC, and a sample of the first ADC may be set as the reference sample RS. In FIG. 9, the reference numerals '1' to '16' may correspond to first to sixteenth ADCs.

In the first cycle CYCLE1, a ninth ADC may be spaced furthest away from the first ADC, which is the reference ADC, and the ninth ADC may be selected as a target ADC.

The data decoder 740 may output the sample of the ninth ADC and samples of two first ADCs to the timing calibrator 120 (e.g., one time skew calibration engine). The timing calibrator 120 may calculate a time skew of the ninth ADC based on a correlation value between the sample of the ninth ADC and the samples of the first ADCs and output a code for calibrating the time skew of the ninth ADC to the clock phase adjuster 130. The clock phase adjuster 130 may adjust the phase of a ninth clock signal to be output to the ninth ADC, according to a received code. The ninth ADC may become a skew-free ADC and second to eight ADCs and tenth to sixteenth ADCs may become uncalibrated ADCs.

In the second cycle CYCLE2, a fifth ADC and a thirteenth ADC may be selected as target ADCs. The data decoder 740 may output a sample of the first ADC, a sample of the fifth ADC, and a sample of the ninth ADC to one time skew calibration engine (e.g., the first time skew calibration engine 120_1). Also, the data decoder 740 may output the sample of the first ADC, the sample of the ninth ADC, and a sample of the thirteenth ADC to another time skew calibration engine (e.g., the second time skew calibration engine 120_2). The one time skew calibration engine may calculate a time skew of the fifth ADC based on a correlation value between the sample of the first ADC, the sample of the fifth ADC, and the sample of the ninth ADC, and, in parallel, the other one time skew calibration engine may calculate a time skew of the thirteenth ADC based on a correlation value between the sample of the first ADC, the sample of the ninth ADC, and the sample of the thirteenth ADC. Fifth, ninth, and thirteenth ADCs may become skew-free ADCs.

In a third cycle CYCLE3, a third ADC, a seventh ADC, an eleventh ADC, and a fifteenth ADC may be selected as target ADCs. Four sample groups may be provided to four time skew calibration engines, respectively. A first sample group includes samples from of the first ADC, samples of the third ADC, and samples of the fifth ADC, a second sample group includes samples of the fifth ADC, samples of the seventh ADC, and samples from the ninth ADC, a third sample group includes samples of the ninth ADC, samples of the eleventh ADC, and samples of the thirteenth ADC, and a fourth group includes samples of the first ADC, samples of the thirteenth ADC, and samples of the fifteenth ADC. The four time skew calibration engines may calculate time skews of third, seventh, eleventh, and fifteenth ADCs in parallel. Third, fifth, seventh, ninth, eleventh, thirteenth, and fifteenth ADCs may become skew-free ADCs.

In a fourth cycle CYCLE4, second, fourth, sixteenth, eighth, tenth, twelfth, fourteenth, and sixteenth ADCs may be selected as target ADCs. In this case, each of eight sample groups includes samples of a target ADC and samples of two adjacent ADCs adjacent to the target ADC. For example, a sample group includes samples of first to third ADCs. A sample group includes samples of third to fifth ADCs. A sample group includes samples of fifth to seventh ADCs, and a sample group includes samples from seventh to ninth ADCs. A sample group includes samples from ninth to eleventh ADCs. A sample group includes samples from eleventh to thirteenth ADCs. A sample group includes samples from thirteenth to fifteenth ADCs. A sample group includes samples from first, fifteenth, and sixteenth ADCs. Time skews occurring in second, fourth, sixth, eighth, tenth, twelfth, fourteenth, and sixteenth ADCs may be removed by eight time skew calibration engines. Second to sixteenth ADCs may become skew-free ADCs.

In some implementations, a correlation value for a target ADC may be repeatedly obtained in each cycle, and a time skew may be calculated based on an average of a plurality of correlation values.

Since a signal with a frequency significantly lower than the Nyquist frequency band needs to be input to the analog-to-digital conversion circuit 700 in the initial cycle, such as the first cycle CYCLE1 of FIG. 9, a foreground calibration operation according to the implementation shown in FIG. 9 is unable to calibrate samples for signals with frequencies up to the Nyquist frequency band and may not be performed as a background operation while the analog-to-digital conversion circuit 700 is performing an analog-to-digital conversion operation.

Figure 10:
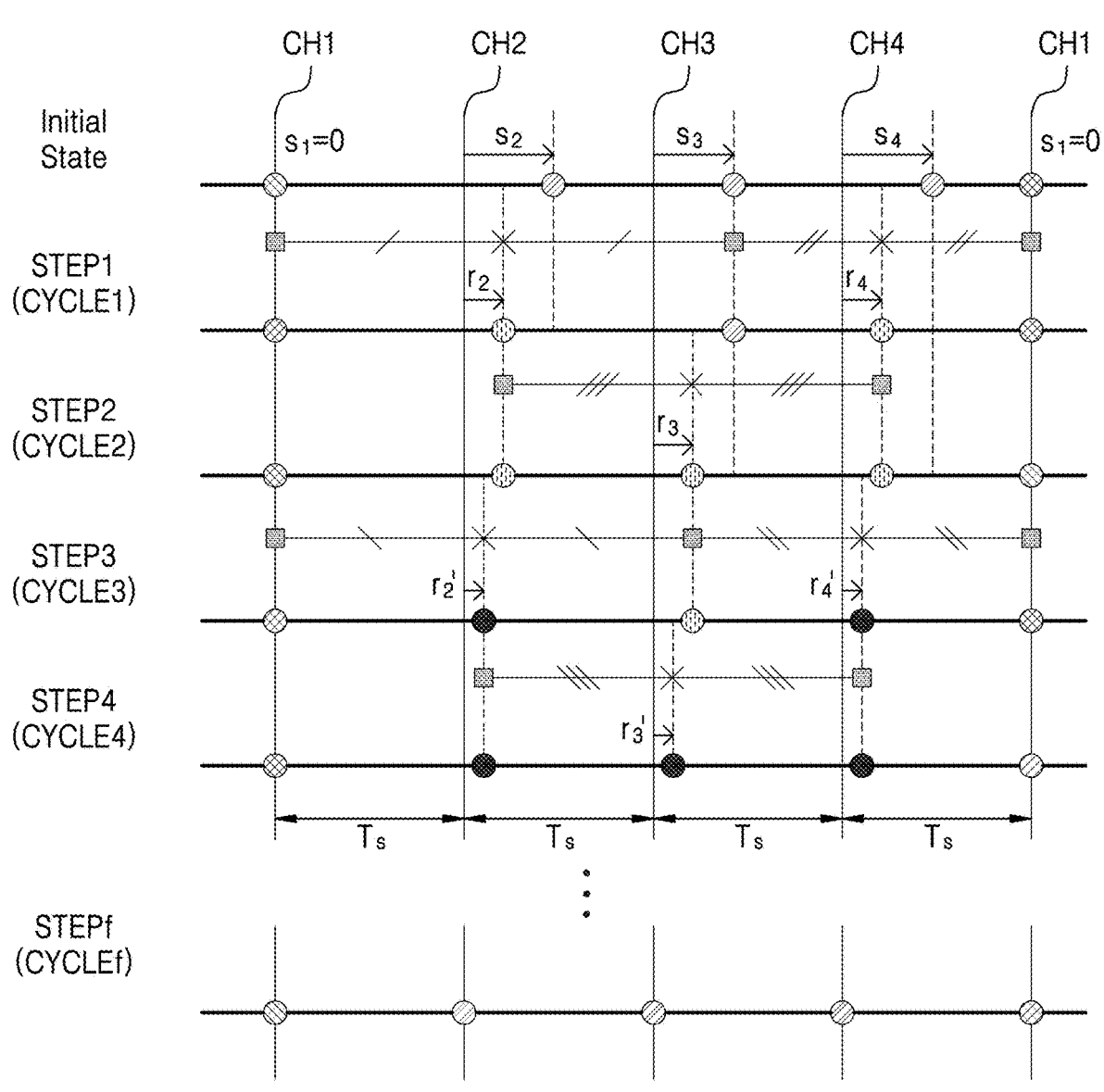
FIGS. 10 and 11 are diagrams illustrating an example of a background calibration operation according to some implementations.
Figure 11:
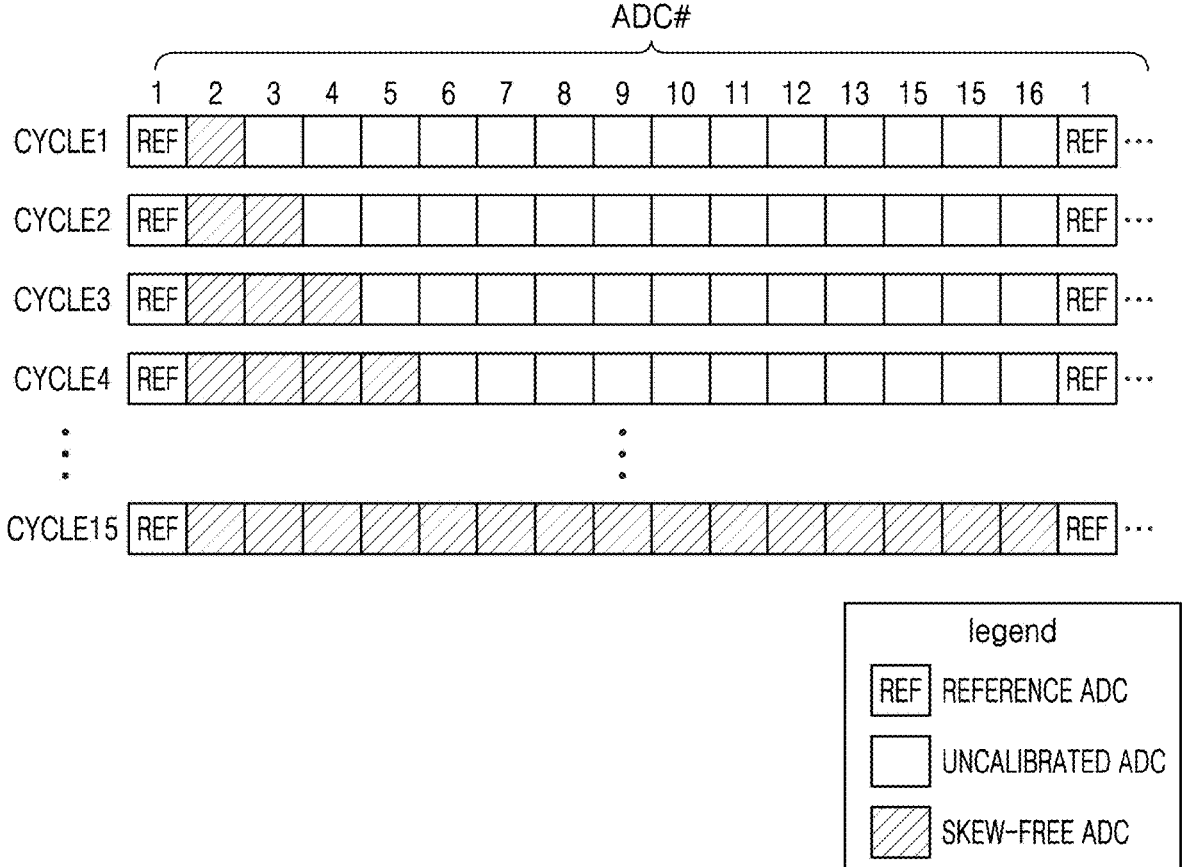

FIGS. 10 and 11 are diagrams illustrating an example of a background calibration operation according to some implementations. In FIGS. 10 and 11, the mode selector 750 may output a second mode signal to the data decoder 740. The data decoder 740 executes the second calibration mode and may output three samples according to the second calibration mode to the timing calibrator 720.

In FIG. 10, in a $(2j-1)$-th cycle, where j is a natural number, based on first correlation values between first target samples of first target ADCs corresponding to any one of an even number channel and an odd number channel and first adjacent samples of first adjacent ADCs adjacent to the first target ADCs, auto-correlation calculation units may calculate first calibration values of the first target ADCs. Next, in a $2j$-th cycle, based on second correlation values between second target samples of second target ADCs different from the first target ADCs and second adjacent samples of second adjacent ADCs adjacent to the second target ADCs, the auto-correlation calculation units may calculate second calibration values of the second target ADCs.

For example, with reference to FIG. 10, as shown in FIG. 5, it is assumed that the number of ADCs is 4 for convenience of explanation, and the channel lines CH1, CH2, CH3, and CH4 may correspond to a reference time line, and each period between adjacent channel lines may be the period Ts. After the fourth ADC is selected, first to fourth ADCs may be alternately selected again. In FIG. 5, a sample located on a channel line indicates that the analog signal ASIG is sampled without a time skew, and a sample not located on a channel line indicates that the analog signal ASIG is sampled with a time skew.

In the initial state, time skews $s_1$, $s_2$, $s_3$, and $s_4$, which are unknowns, may occur in the four ADCs, respectively, and samples of the four ADCs may be referred to as the uncalibrated samples US. According to some implementations, the sample of the first ADC may be set as the reference sample RS, and it is assumed that a first time skew $s_1$ is 0.

In the first cycle CYCLE1 of the first step STEP1, based on first correlation values between first target samples of first target ADCs corresponding to any one of an even number channel and an odd number channel and first adjacent samples of first adjacent ADCs adjacent to the first target ADCs, auto-correlation calculation units included in the timing calibrator 720 may calculate first calibration values of the first target ADCs. For example, with reference to FIG. 10, in the first cycle CYCLE1, first target ADCs may include a second ADC and a fourth ADC corresponding to even number channels. Samples of first to third ADCs may be provided to the timing calibrator 720 by the data decoder 740. Also, samples of first, third, and fourth ADCs may be provided to the timing calibrator 720 by the data decoder 740. As described above with reference to FIG. 5, a calibration value of the second ADC and a calibration value of the fourth ADC may be calculated. Samples of second and fourth ADCs calibrated in the first cycle CYCLE1 may each be referred to as a first calibrated sample CS_1.

In the second cycle CYCLE2 of the second step STEP2, based on second correlation values between second target samples of second target ADCs different from the first target ADCs and second adjacent samples of second adjacent ADCs adjacent to the second target ADCs, auto-correlation calculation unit included in the timing calibrator 720 may calculate second calibration values of the second target ADCs. For example, with reference to FIG. 10, in the second cycle CYCLE2, second target ADCs may include a first ADC and a third ADC corresponding to odd number channels. When the first ADC is the reference ADC, the third ADC may be the second target ADC in the second cycle CYCLE2. Samples of second to fourth ADCs may be provided to the timing calibrator 720 by the data decoder 740. As described above with reference to FIG. 5, a calibration value of the third ADC may be calculated. Samples of the third ADC calibrated in the second cycle CYCLE2 may be referred to as the first calibrated sample CS_1.

In the third cycle CYCLE3 of the third step STEP3, first calibration values of the first target ADCs may be calculated in the same regard as in the first cycle CYCLE1. In the fourth cycle CYCLE4 of a fourth step STEP4, second calibration values of the second target ADCs may be calculated in the same regard as in the second cycle CYCLE2. A sample of the first target ADC calibrated in the third cycle CYCLE3 and a sample of the second target ADC calibrated in the fourth cycle CYCLE4 may each be referred to as a second calibrated sample CS_2. As described above, every time a cycle is repeated, calibration values of ADCs corresponding to odd number channels and calibration values of ADCs corresponding to even number channels may be calculated alternately, and, as calibration values are alternately calculated, positions of calibrated sample may gradually move onto channel lines.

In a final cycle CYCLEf of a final step STEPf, time skews of target ADCs may be removed, and the skew-free samples SFS of the target ADCs may be located on the channel lines CH1, CH2, CH3, and CH4.

In FIG. 11, an auto-correlation calculation unit included in a time skew calibration engine may sequentially calculate a time skew of one target ADC based on correlation values between a sample of the one target ADC and samples of adjacent ADCs adjacent to the one target ADC, in each cycle.

For example, with reference to FIG. 11, it is assumed that the number of ADCs is 16. From among the 16 ADCs, a first ADC may be set as the reference ADC, and the reference numerals '1' to '16' in FIG. 11 may correspond to first to sixteenth ADCs, respectively.

In the first cycle CYCLE1, a second ADC may be selected as the target ADC, and the data decoder 740 may output samples of first to third ADCs to the timing calibrator 720. A time skew of the second ADC may be calculated by the timing calibrator 120. The clock phase adjuster 130 may adjust the phase of a second clock signal to be output to the second ADC according to a code for calibrating the time skew of the second ADC. The second ADC may become a skew-free ADC.

In the second cycle CYCLE2, a third ADC may be selected as the target ADC, and samples of second to fourth ADCs may be output to the timing calibrator 720. Second and third ADCs may become skew-free ADCs.

In the third cycle CYCLE3, samples of a fourth ADC, the third ADC, and a fifth ADC selected as target ADCs may be output to the timing calibrator 720. A time skew occurring in the fourth ADC may be removed.

In the fourth cycle CYCLE4, the fifth ADC may be selected as the target ADC, and samples of fourth to sixth ADCs may be output to the timing calibrator 720. In this regard, one ADC adjacent to one target ADC selected in a previous cycle may be selected as a target ADC in a next cycle, and samples of a target ADC and two adjacent ADCs may be output to the timing calibrator 720. a time skew occurring in a sixteenth ADC selected as the target ADC in a fifteenth cycle CYCLE15 may be removed.

In some implementations, a correlation value for a target ADC may be repeatedly obtained in each cycle, and a time skew may be calculated based on an average of a plurality of correlation values.

Accordingly, since time skews may be calibrated through a background calibration operation, increase of the time of a calibration operation may be insignificant.

FIGS. 12, 13, 14, and 15 are block diagrams showing an example of a mode selector according to some implementations. In FIGS. 12, 13, 14, and 15, the mode selector 750 may include at least one sensor unit, a register unit, a determination unit, and a signal output unit. The at least one sensor unit may detect the internal thermal environment and output a detection signal including a detected value of the detected internal thermal environment. The register unit may store the detected value. The determination unit may monitor a value stored in the register, compare a monitored value with a reference range, and output a comparison result. The signal output unit may output a mode signal MDSIG based on the comparison result.

Figure 12:
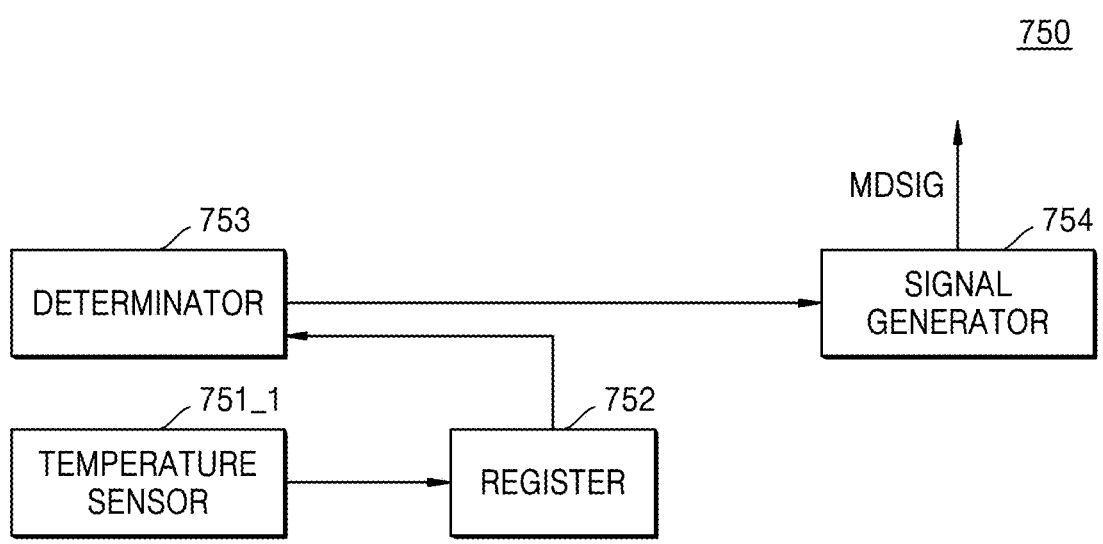
FIGS. 12, 13, 14, and 15 are block diagrams showing an example of a mode selector according to some implementations.

In FIG. 12, the mode selector 750 may include a temperature sensor 751_1, a register 752, a determinator 753, and a signal generator 754. The temperature sensor 751_1 may detect the temperature of the analog-to-digital conversion circuit 700 and output a detected temperature value to the register 752. The register 752 may store temperature values. When a reset signal or a power-on signal is input to the analog-to-digital conversion circuit 700, temperature values stored in the register 752 may be deleted. The determinator 753 may monitor temperature values stored in the register 752 and compare the temperature values with a first reference range. The first reference range may be a range of temperatures for the analog-to-digital conversion circuit 700 to operate normally. When the temperature value is outside the first reference range, the determinator 753 may output a state value indicating an abnormal state to the signal generator 754 as a comparison result. The signal generator 754 may output a second mode signal in response to a state value. Meanwhile, the signal generator 754 may output a first mode signal in response to a reset signal, a power-on signal, etc.

Figure 13:
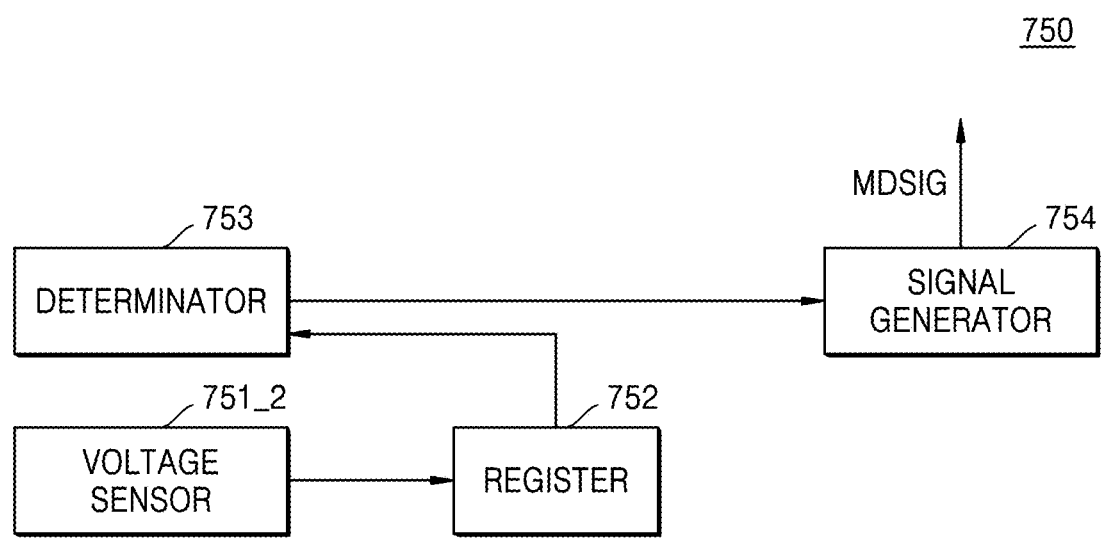

In FIG. 13, the mode selector 750 may include a voltage sensor 7512, the register 752, the determinator 753, and the signal generator 754. The voltage sensor 7512 may output a value corresponding to the level of a voltage to the register 752. The determinator 753 may compare a value stored in the register 752 with a second reference range. The second reference range may be a range of voltages for the analog-to-digital conversion circuit 700 to operate normally. When a voltage value is outside the second reference range, the determinator 753 may output a state value indicating an abnormal state to the signal generator 754 as a comparison result.

Figure 14:
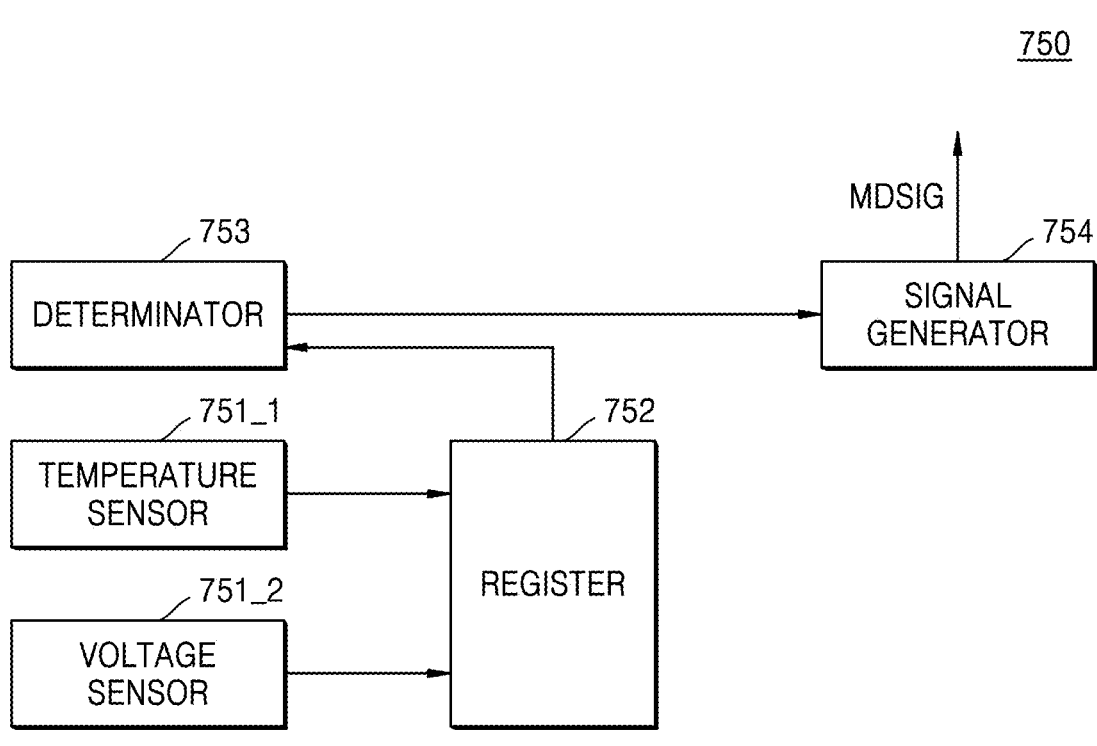

In FIG. 14, the mode selector 750 may include the temperature sensor 751_1, the voltage sensor 751_2, the register 752, the determinator 753, and the signal generator

754. The register 752 may store a temperature value of the temperature sensor 751_1 and a value of the voltage sensor 751_2. The determinator 753 may compare a temperature value of the temperature sensor 751_1 with the first reference range and compare a value of the voltage sensor 751_2 with the second reference range. When the temperature value of the temperature sensor 751_1 and/or the value of the voltage sensor 751_2 are outside a corresponding reference range, the determinator 753 may output a state value indicating an abnormal state to the signal generator 754 as a comparison result.

Figure 15:
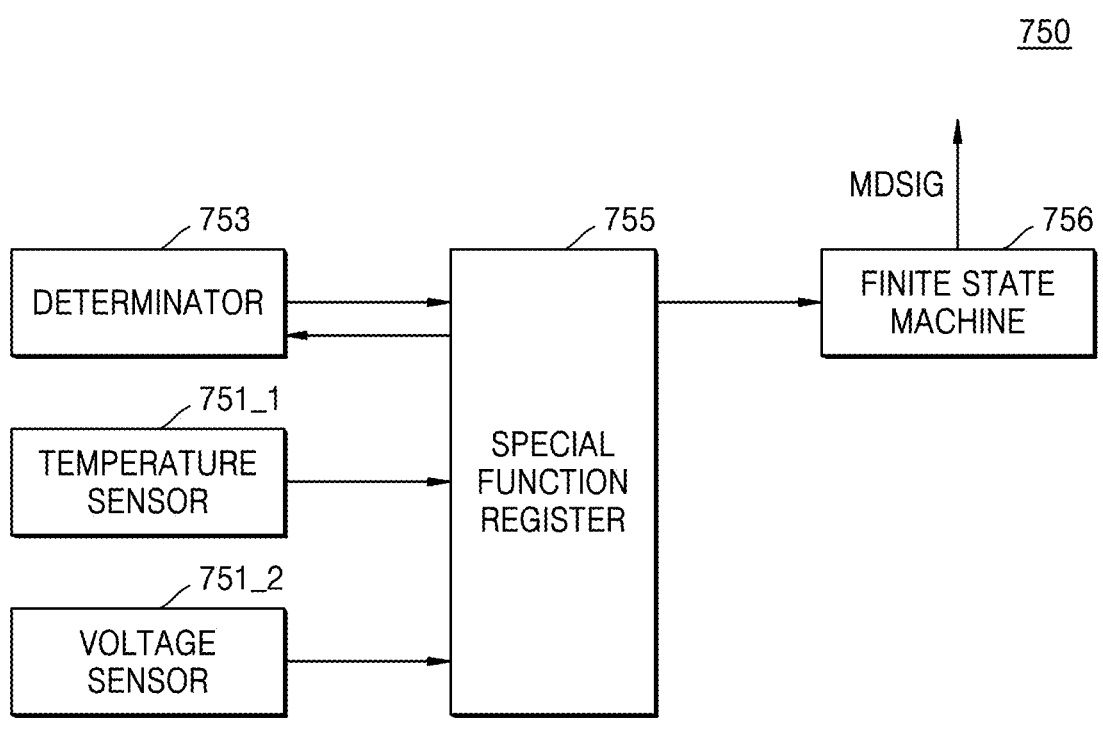

In FIG. 15, the mode selector 750 may include the temperature sensor 751_1, the voltage sensor 751_2, a special function register (SFR) 755, the determinator 753, and a finite state machine (FSM) 756. The SFR 755, like the register 752, may store detected values of the temperature sensor 751_1 and the voltage sensor 751_2. The determinator 753 may monitor values stored in the SFR 755 and output a status value to the SFR 755 as a comparison result. The SFR 755 may store a state value output from the determinator 753. The FSM 756 may have a foreground state or a background state as its current state. The FSM 756 may monitor a state value stored in the SFR 755, and the state of the FSM 756 may transition between the foreground state and the background state according to the state value. A signal representing the current state of the FSM 756 may be output as the mode signal MDSIG.

Figure 16:
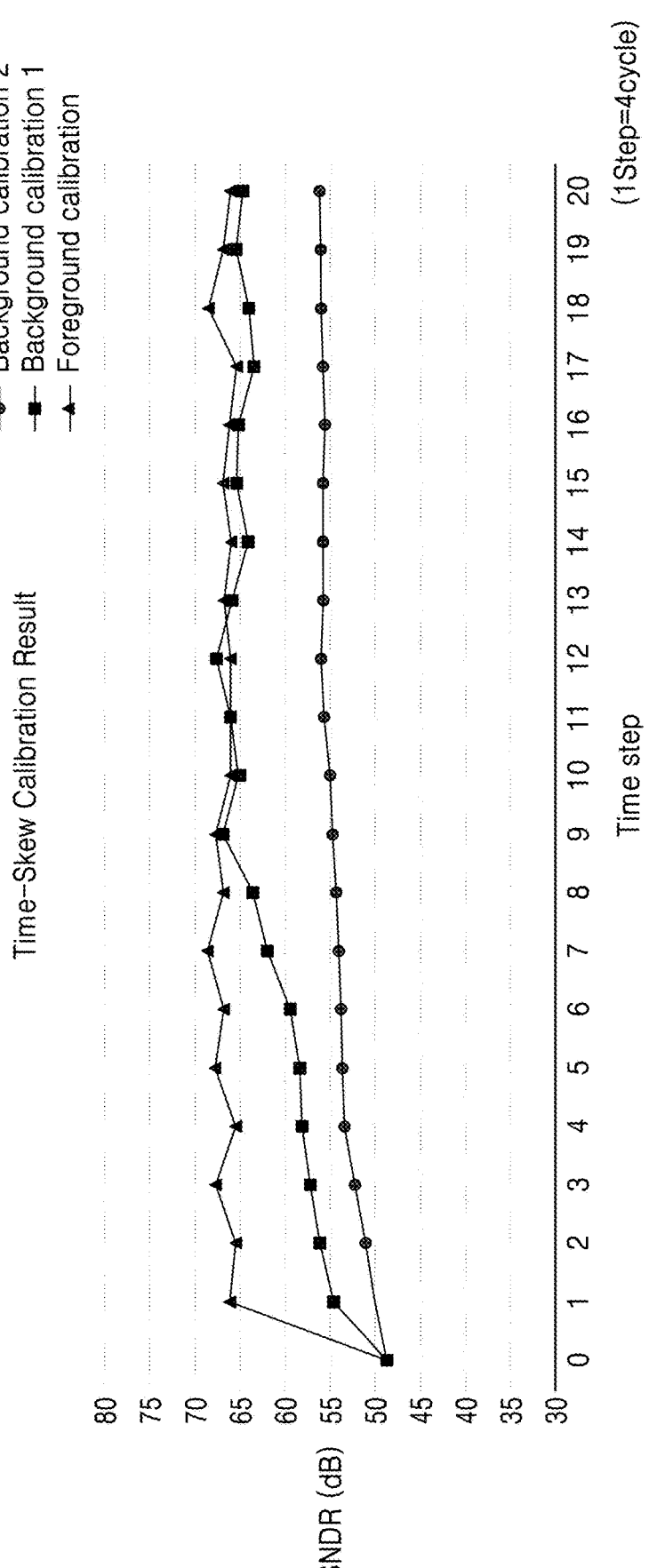
FIG. 16 is a graph illustrating an example of a signal-to-noise distortion ratio (SNDR) according to a time step for each calibration operation according to some implementations.

FIG. 16 is a graph illustrating an example of a Signal-to-Noise Distortion Ratio (SNDR) according to a time step for each calibration operation according to some implementations. In FIG. 16, an SNDR according to a time step may be illustrated for each of a foreground calibration, a background calibration 1, and a background calibration 2. For example, the foreground calibration corresponds to the embodiment described above with reference to FIG. 9, the background calibration 1 corresponds to the embodiment described above with reference to FIG. 5 or 10, and the background calibration 2 corresponds to the implementation described above with reference to FIG. 11.

The foreground calibration is the fastest, and the background calibration 1 is slightly slower than the foreground calibration. However, the final performance of the background calibration 1 is identical to that of the foreground calibration. The background calibration 2 is slower than background calibration 1. However, when a large number of time steps are repeated, the final performance of the background calibration 2 becomes identical to that of the background calibration 1.

Figure 17:
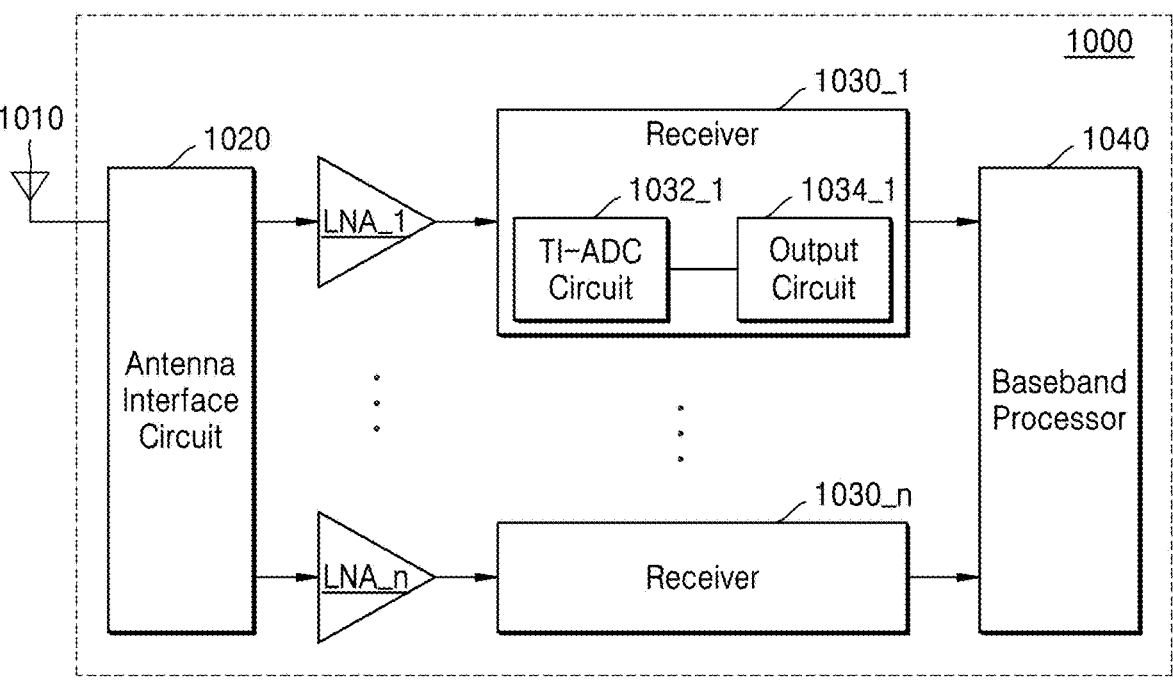
FIG. 17 is a block diagram showing an example of a wireless communication device according to some implementations.

FIG. 17 is a block diagram showing an example of a wireless communication device according to some implementations. In FIG. 17, the wireless communication device 1000 may include an antenna 1010, an antenna interface circuit 1020, a plurality of low noise amplifiers LNA_1 to LNA_n, a plurality of receivers 1030_1 to 1030_n, and a baseband processor 1040.

The antenna interface circuit 1020 may rout an analog signal received through the antenna 1010 to any one of the receivers 1030_1 to 1030_n. The antenna interface circuit 1020 may include switch elements, a duplexer, a filter circuit, an input matching circuits, etc.

The low noise amplifiers LNA_1 to LNA_n may perform low noise amplification on the received analog signal and output a result thereof to the receivers 1030_1 to 1030_n connected thereto.

The baseband processor 1040 may perform a processing operation including a modulation operation on digital signals transmitted from the receivers 1030_1 to 1030_n.

According to some implementations, a first receiver 1030_1 may include an analog-to-digital conversion circuit 1032_1 to which example implementations of the present disclosure are applied and an output circuit 1034_1. The analog-to-digital conversion circuit 1032_1 may convert an analog signal received from a first low-noise amplifier LNA_1 to a digital signal and may perform a timing calibration operation to which the present disclosure is applied during a conversion operation. Also, the analog-to-digital conversion circuit 1032_1 may perform timing calibration as a background operation. Therefore, since a timing skew error is corrected in advance, the analog-to-digital conversion circuit 1032_1 may quickly provide a digital signal with improved quality to the baseband processor 1040 during an analog-to-digital conversion operation. According to some implementations, the first receiver 1030_1 may further include the first low-noise amplifier LNA_1. The configuration of the first receiver 1030_1 may be applied to the other receivers 1030_2 to 1030_n.

According to some implementations, the output circuit 1034_1 may perform an operation of improving quality of a digital signal output from the analog-to-digital conversion circuit 1032_1. For example, the output circuit 1034_1 may equalize a digital signal based on at least one of Continuous Time Linear Equalization (CTLE), Decision Feedback Equalization (DFE), and FeedForward Equalization (FFE).

Figure 18:
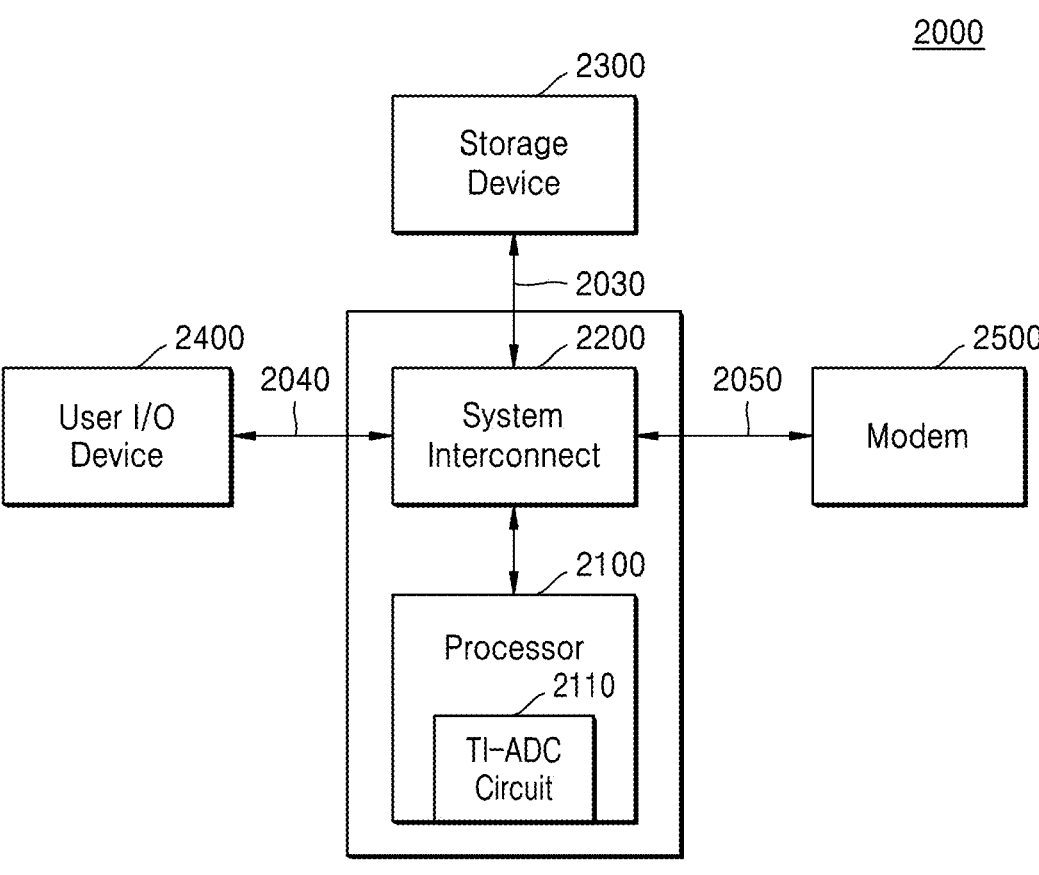
FIG. 18 is a block diagram showing an example of a computing system according to some implementations.

FIG. 18 is a block diagram showing an example of a computing system according to some implementations. In FIG. 18, the computing system 2000 may include a processor 2100, a system interconnect 2200, a storage device 2300, a user input/output device 2400, and a modem 2500. According to some implementations, the processor 2100, the system interconnect 2200, the storage device 2300, the user input/output device 2400, and the modem 2500 may be mounted on a single substrate. The storage device 2300, the user input/output device 2400, and the modem 2500 may be connected to the system interconnect 2200 via channels 2030, 2040, and 2050, respectively. The channels 2030, 2040, and 2050 may each be based on one of various standards like Peripheral Component Interconnect Express (PCIe), Nonvolatile Memory Express (NVME), Advanced Extensible Interface (AXI), and ARM Microcontroller Bus Architecture (AMBA).

The storage device 2300 may function as a memory of the computing system 2000. The storage device 2300 may store an operation system driven by the processor 2100, applications, and original copies of user data. The storage device 2300 may include a hard disk drive (HDD), solid state drive (SSD), and an optical disk drive (ODD).

The user input/output device 2400 may be configured to exchange information with a user. The user input/output device 2400 may include a user input device for receiving information from a user, e.g., a keyboard, a mouse, a touch panel, an operation sensor, a microphone, etc. The user input/output device 2400 may include a user output device for providing information to a user, e.g., a display device, a speaker, a beam projector, a printer, etc.

The modem 2500 may be configured to exchange data with an external device wirelessly or via a wire. In an example implementation, the modem 2500 may be integrated with the processor 2100.

The processor 2100 may include a central processing unit or an application processor that controls the computing system 2000 and performs various operations. The processor 2100 may include an analog-to-digital conversion circuit 2110 to which implementations of the present disclosure are applied. The analog-to-digital conversion circuit 2110 may convert analog signals received from the storage device 2300, the user input/output device 2400, and the modem 2500 through the system interconnect 2200 to digital signals and perform timing calibration to which the present disclosure is applied during a conversion operation. Also, the analog-to-digital conversion circuit 2110 may perform timing calibration as a background operation. Accordingly, since a timing skew error is corrected in advance, the analog-to-digital conversion circuit 2110 may quickly provide a digital signal with improved quality to the processor 2100 during an analog-to-digital conversion operation. According to some implementations, the analog-to-digital conversion circuit 2110 may be embedded to the system interconnect 2200.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. An analog-to-digital conversion circuit comprising:
a plurality of analog-digital converters (ADCs), each configured to sample an analog signal based on a clock signal in a time-interleaving manner;
a timing calibrator circuit configured to
calculate calibration values of the plurality of ADCs based on correlation values between target samples output from target ADCs from among the plurality of ADCs and adjacent samples output from adjacent ADCs adjacent to the target ADCs in two respective cycles,
calculate a plurality of time skews regarding sampling timings of the plurality of ADCs based on the calibration values and a plurality of calibration parameters, and
output codes for calibrating the plurality of time skews; and
a clock phase adjuster circuit configured to adjust phases of a plurality of clock signals based on the codes, and provide adjusted phases of the plurality of clock signals to the plurality of ADCs.

2. The analog-to-digital conversion circuit of claim 1, wherein the timing calibrator circuit is configured to:
calculate, n a first cycle, first calibration values of first target ADCs, which correspond to any one channel of even number channels and odd number channels, from among the plurality of ADCs, based on first correlation values between first target samples of the first target ADCs and first adjacent samples of first adjacent ADCs adjacent to the first target ADCs, and,
calculate, in a second cycle, second calibration values of second target ADCs, which are different from the first target ADCs, based on second correlation values between second target samples of the second target ADCs and second adjacent samples of second adjacent ADCs adjacent to the second target ADCs.

3. The analog-to-digital conversion circuit of claim 1, wherein the timing calibrator circuit is configured to calculate the plurality of time skews according to:

$$\begin{bmatrix} s_1 \\ s_k \\ \vdots \\ s_n \end{bmatrix} = H^{-1} \begin{bmatrix} a_1 \\ a_k \\ \vdots \\ a_n \end{bmatrix}$$

wherein $s_k$ denotes a timing skew for a sampling timing of a k-th ADC, k is a natural number greater than or equal to 2 and smaller than n, $H^{-1}$ denotes a matrix containing the plurality of calibration parameters, and $a_k$ denotes a calibration value of the k-th ADC.

4. The analog-to-digital conversion circuit of claim 1, further comprising:
a data decoder configured to execute a calibration mode selected from a plurality of calibration modes according to a mode signal and output at least one sample group including samples of three ADCs selected from among samples of the plurality of ADCs based on the calibration mode; and
a mode selector configured to output the mode signal to the data decoder based on an internal thermal environment of the analog-to-digital conversion circuit and a reference range of the analog-to-digital conversion circuit.

5. The analog-to-digital conversion circuit of claim 4, wherein the mode selector is configured to output the mode signal as a first mode signal indicating a first calibration mode to the data decoder, and
wherein the timing calibrator circuit is configured to:
calculate, based on correlation values between samples of a reference ADC from among the plurality of ADCs and samples of an i-th target ADC, which is furthest away from the reference ADC, a time skew of the i-th target ADC,
calculate, based on correlation values between the sample of the reference ADC and a sample of an ADC whose time skew has been calibrated, time skews of (i+1)-th target ADCs that are equally spaced apart from the reference ADC and the ADC whose time skew has been calibrated, and,
calculate, based on correlation values between samples of ADCs whose time skews have been calibrated, time skews of (i+1)-th target ADCs that are equally spaced apart from the ADCs whose time skews have been calibrated.

6. The analog-to-digital conversion circuit of claim 4, wherein the mode selector is configured to output the mode signal as a second mode signal indicating a second calibration mode to the data decoder, and
wherein the timing calibrator circuit is configured to:
calculate, in a (2j−1)-th cycle, the j being a natural number, first calibration values of first target ADCs, which correspond to any one channel of even number channels and odd number channels, based on first correlation values between first target samples of the first target ADCs and first adjacent samples of first adjacent ADCs adjacent to the first target ADCs, and,
calculate, in a 2j-th cycle, second calibration values of second target ADCs, which are different from the first target ADCs, based on second correlation values between second target samples of the second target ADCs and second adjacent samples of second adjacent ADCs adjacent to the second target ADCs.

7. The analog-to-digital conversion circuit of claim 4, wherein the mode selector is configured to output the mode signal as a second mode signal indicating a second calibration mode to the data decoder, and wherein the timing calibrator circuit is configured to calculate a time skew of one target ADC based on correlation values between a sample of the one target ADC and samples of adjacent ADCs adjacent to the one target ADC, sequentially in each cycle.

8. The analog-to-digital conversion circuit of claim 4, wherein the mode selector comprises:

at least one sensor configured to detect the internal thermal environment and output a detection signal comprising a detected value of a detected internal thermal environment;

a register configured to store a detected value;

a comparator circuit configured to monitor a value stored in the register, compare a monitored value with the reference range, and output a comparison result; and a signal generator configured to output the mode signal based on the comparison result.

9. The analog-to-digital conversion circuit of claim 8, wherein the at least one sensor comprises a temperature sensor configured to output a temperature value to the register, and wherein the comparator circuit is configured to compare the temperature value with a first reference range.

10. The analog-to-digital conversion circuit of claim 8, wherein the at least one sensor comprises a voltage sensor configured to output a value corresponding to a level of a voltage to the register, and wherein the comparator circuit is further configured to compare the value with a second reference range.

11. The analog-to-digital conversion circuit of claim 8, wherein the at least one sensor comprises:

a temperature sensor configured to output a temperature value to the register; and a voltage sensor configured to output a value corresponding to a level of a voltage to the register, and wherein the comparator circuit is configured to compare the temperature value with a first reference range and compare the value with a second reference range.

12. The analog-to-digital conversion circuit of claim 1, wherein the timing calibrator circuit comprises a plurality of time skew calibration engines configured in parallel to calculate a correlation value between a target sample of one target ADC and adjacent samples of two adjacent ADCs adjacent to the target ADC.

13. The analog-to-digital conversion circuit of claim 12, wherein each the plurality of time skew calibration engines comprises:

an auto-correlation calculator configured to calculate a difference between a first value obtained by multiplying the target sample by a first adjacent sample of a first adjacent ADC and a second value obtained by multiplying the target sample by a second adjacent sample of a second adjacent ADC to repeatedly calculate the correlation value in each cycle and calculate a plurality of calibration values of each ADC based on a plurality of correlation values of each ADC;

an integrator configured to calculate an average of a plurality of calibration values of each ADC and calculate an average calibration value of each of the plurality of ADCs; and a post-processor configured to calculate the plurality of time skews based on average calibration values of the plurality of ADCs and the plurality of calibration parameters.

14. A receiver comprising:

an analog-to-digital conversion circuit configured to convert an analog signal to a digital signal; and an output circuit configured to improve quality of the digital signal, wherein the analog-to-digital conversion circuit comprises:

a plurality of analog-digital converters (ADCs) each configured to sample an analog signal based on a clock signal in a time-interleaving manner;

a timing calibrator circuit configured to calculate calibration values of the plurality of ADCs based on correlation values between target samples output from target ADCs from among the plurality of ADCs and adjacent samples of adjacent ADCs adjacent to the target ADCs in two respective cycles, calculate time skews regarding sampling timings of the plurality of ADCs based on the calibration values and a plurality of calibration parameters, and output codes for calibrating the time skews; and a clock phase adjuster configured to adjust phases of a plurality of clock signals to be provided to the plurality of ADCs based on the codes.

15. The receiver of claim 14, wherein the timing calibrator circuit is configured to:

calculate, in a first cycle, first calibration values of first target ADCs, which correspond to any one channel of even number channels and odd number channels, from among the plurality of ADCs, based on first correlation values between first target samples of the first target ADCs and first adjacent samples of first adjacent ADCs adjacent to the first target ADCs, and, calculate, in a second cycle, second calibration values of second target ADCs, which are different from the first target ADCs, based on second correlation values between second target samples of the second target ADCs and second adjacent samples of second adjacent ADCs adjacent to the second target ADCs.

16. A timing calibration circuit comprising:

auto-correlation calculators, each configured to calculate, based on a correlation value between target samples output from target time interleaved analog-to-digital converters (TI-ADCs) from among a plurality of TI-ADCs in two respective cycles and adjacent samples output from adjacent TI-ADCs mutually adjacent to the target TI-ADCs, calibration values of the target TI-ADCs selected in the two respective cycles; and a post-processor configured to calculate, based on the calibration values of the target TI-ADCs and a plurality of calibration parameters determined in advance, time skews regarding sampling timings of the target TI-ADCs.

17. The timing calibration circuit of claim 16, wherein an auto-correlation calculator is further configured to:

calculate, in a first cycle, based on a first correlation value between a first target sample of a first target TI-ADC and first adjacent samples of first adjacent TI-ADCs adjacent to the first target TI-ADC, a first calibration value of the first target TI-ADC, and, calculate, in a second cycle, based on a second correlation value between a second target sample of a second target TI-ADC different from the first target TI-ADC and second adjacent samples of second adjacent TI-ADCs adjacent to the second target TI-ADC, a second calibration value of second target TI-ADC.

18. The timing calibration circuit of claim 17, wherein the auto-correlation calculator is further configured to calculate the time skews according to:

$$\begin{bmatrix} s_1 \\ s_2 \end{bmatrix} = H^{-1} \begin{bmatrix} a_1 \\ a_2 \end{bmatrix}$$

wherein $s_1$ denotes a first timing skew of the first target TI-ADC, $s_2$ denotes a second timing skew of the second target TI-ADC, $H^{-1}$ denotes a matrix containing the plurality of calibration parameters, $a_1$ denotes a first calibration value of the first target TI-ADC, and $a_2$ denotes a second calibration value of the second target TI-ADC.

19. The timing calibration circuit of claim 18, wherein the timing calibration circuit further comprises an integrator configured to calculate an average of a plurality of first calibration values of the first target TI-ADC to calculate a first average calibration value of the first target ADC and calculate an average of a plurality of second calibration values of the second target TI-ADC to calculate a second average calibration value of the second target ADC, wherein the auto-correlation calculator is further configured to calculate the plurality of first calibration values by repeatedly calculating the first calibration value of the first target TI-ADC in the first cycle, and calculate the plurality of second calibration values by repeatedly calculating the second calibration value of the second target TI-ADC in the second cycle, and wherein the post-processor is further configured to calculate the first time skew and the second time skew, the first average calibration value of the first target TI-ADC, and the second average calibration value of the second target TI-ADC.

20. The timing calibration circuit of claim 19, wherein the first target TI-ADC corresponds to any one of an even number channel and an odd number channel, and wherein the second target TI-ADC corresponds to the other one of the even number channel and the odd number channel.

* * * * *